United States Patent
Nagumo

(10) Patent No.: US 12,546,383 B2
(45) Date of Patent: Feb. 10, 2026

(54) FRICTION TRANSMISSION DEVICE

(71) Applicant: SUMITOMO HEAVY INDUSTRIES, LTD., Tokyo (JP)

(72) Inventor: Toshiya Nagumo, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 18/899,175

(22) Filed: Sep. 27, 2024

(65) Prior Publication Data

US 2025/0020190 A1 Jan. 16, 2025

Related U.S. Application Data

(63) Continuation of application No. PCT/JP2023/012904, filed on Mar. 29, 2023.

(30) Foreign Application Priority Data

Mar. 31, 2022 (JP) ................................. 2022-058090

(51) Int. Cl.
*F16H 15/50* (2006.01)
*F16H 15/52* (2006.01)

(52) U.S. Cl.
CPC .......... *F16H 15/52* (2013.01); *F16H 15/503* (2013.01)

(58) Field of Classification Search
CPC ........ F16H 15/52; F16H 15/503; F16H 13/06; F16H 13/10; F16H 13/14; F16H 13/08
See application file for complete search history.

(56) References Cited

U.S. PATENT DOCUMENTS

| 9,702,459 | B2 * | 7/2017 | Kliewer | .............. F16H 61/6649 |
| 12,013,014 | B2 | 6/2024 | Nagumo | |
| 2014/0094339 | A1 * | 4/2014 | Ogawa | .................. F16H 57/043 |
| | | | | 476/38 |

(Continued)

FOREIGN PATENT DOCUMENTS

| CN | 105889440 A | * | 8/2016 | ........... F16H 15/503 |
| EP | 2916041 A1 | * | 9/2015 | ............. F16H 15/52 |
| JP | 39-6259 B1 | | 5/1964 | |

(Continued)

OTHER PUBLICATIONS

International Search Report mailed on May 23, 2023 for the corresponding PCT Application No. PCT/JP2023/012904, with English machine translation.

*Primary Examiner* — Justin Holmes
(74) *Attorney, Agent, or Firm* — Michael Best & Friedrich LLP

(57) ABSTRACT

A friction transmission device includes: an input trajectory ring; a planetary rolling body that is disposed about a rotation axis line of the input trajectory ring and that comes into contact with the input trajectory ring; an output trajectory ring that comes into contact with the planetary rolling body and that is connected to an output member; and a first support trajectory ring and a second support trajectory ring that come into contact with the planetary rolling body; in which at least one of the input trajectory ring, the output trajectory ring, the first support trajectory ring, or the second support trajectory ring is a convex-concave contact trajectory ring that comes into convex-concave contact with the planetary rolling body.

10 Claims, 15 Drawing Sheets

(56) References Cited

U.S. PATENT DOCUMENTS

2023/0003284 A1   1/2023   Nagumo

FOREIGN PATENT DOCUMENTS

| JP | 10-196750 A | 7/1998 |
| JP | 2009-41582 A | 2/2009 |
| JP | 2016-8675 A | 1/2016 |
| JP | 2019-210944 A | 12/2019 |
| WO | 2021/182001 A1 | 9/2021 |

* cited by examiner

FIG. 5A
FIG. 5B
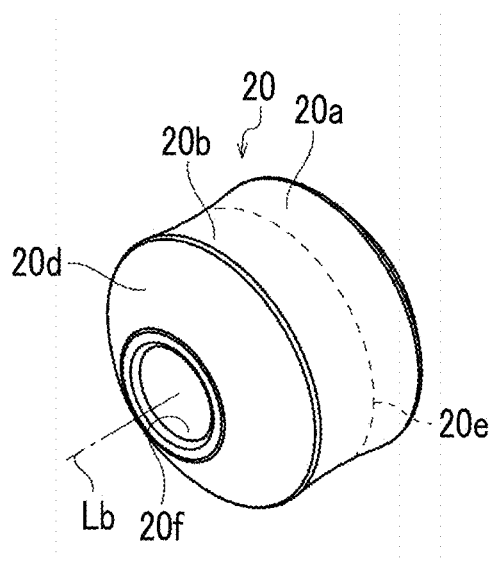
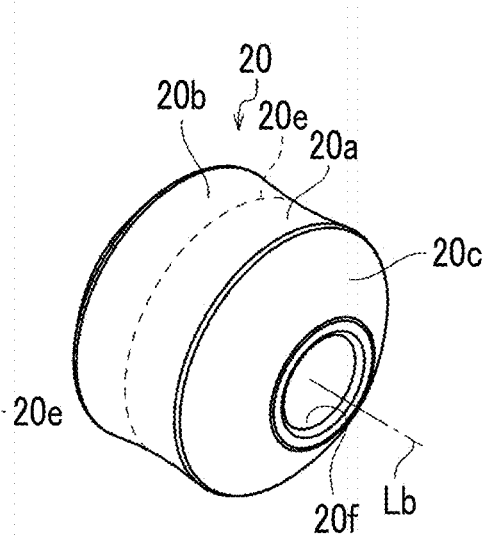

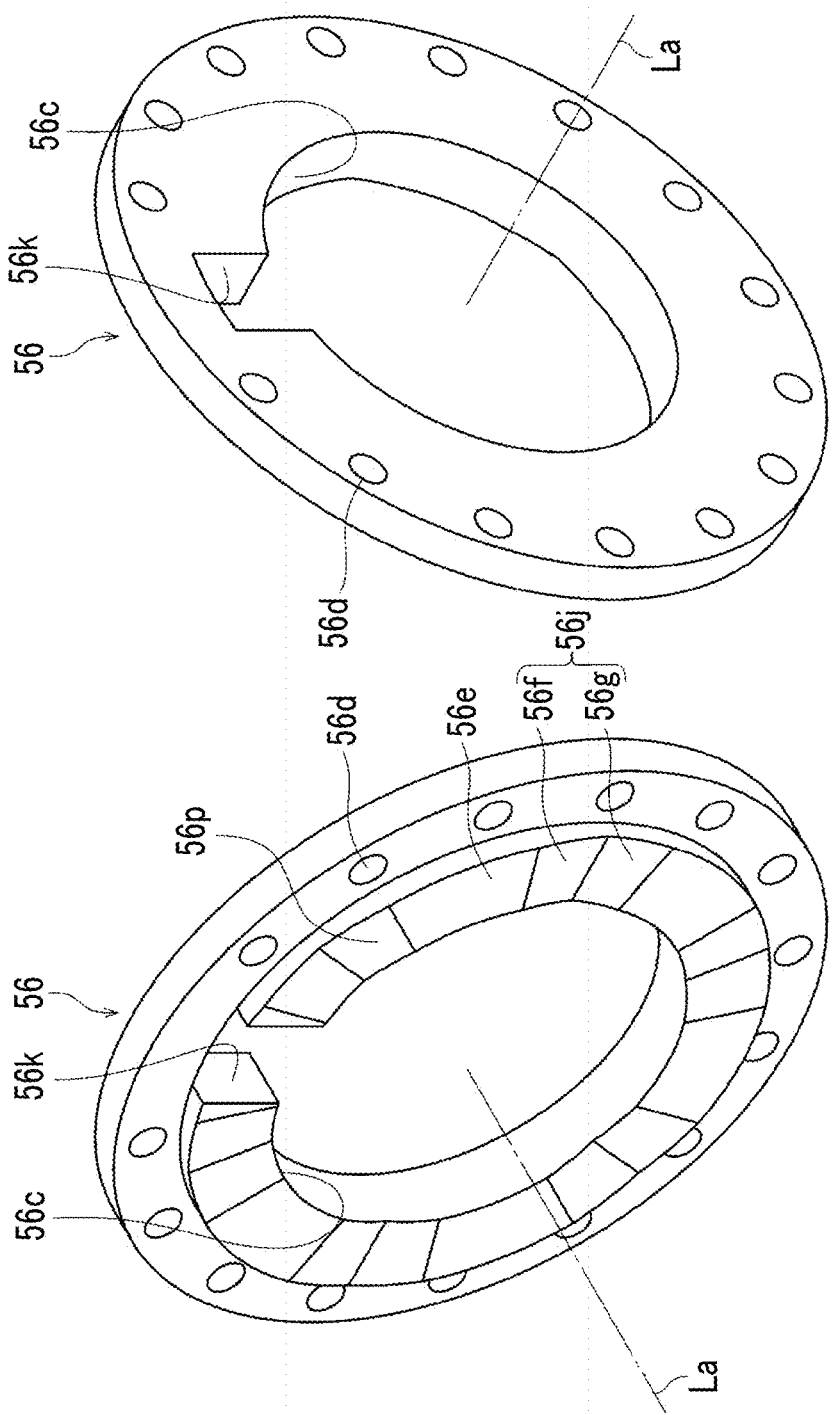

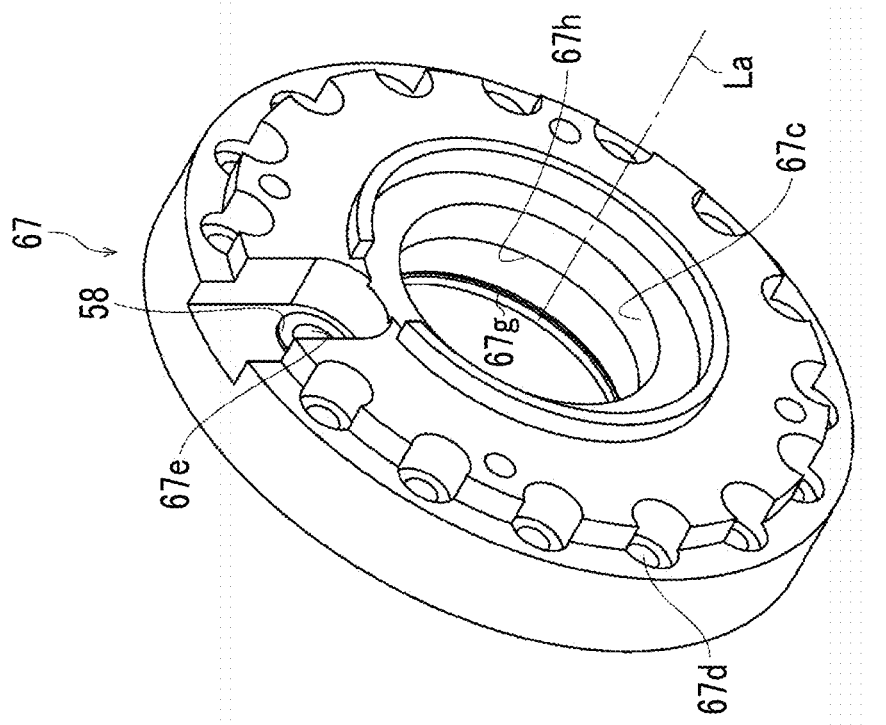
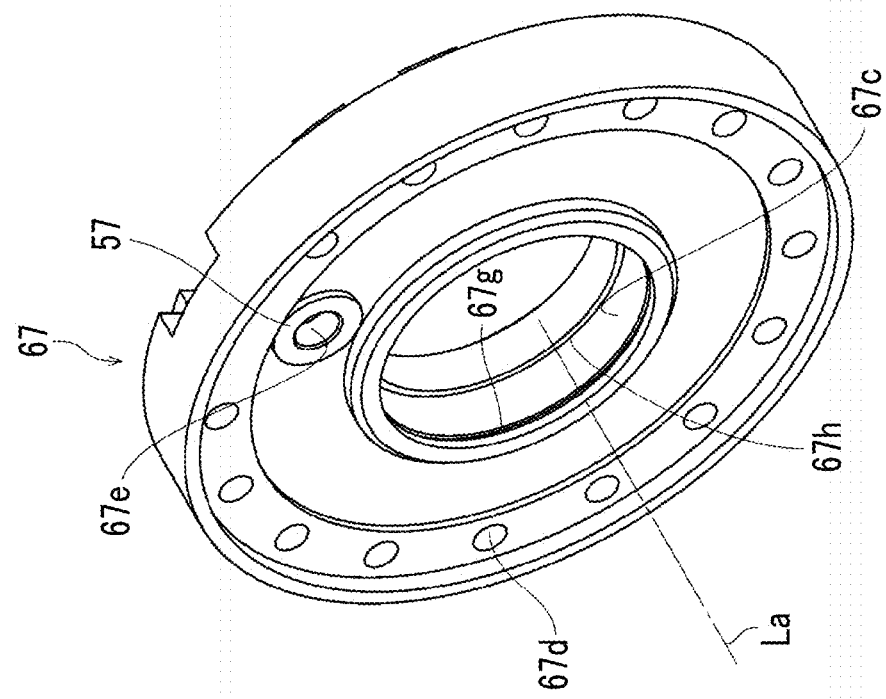

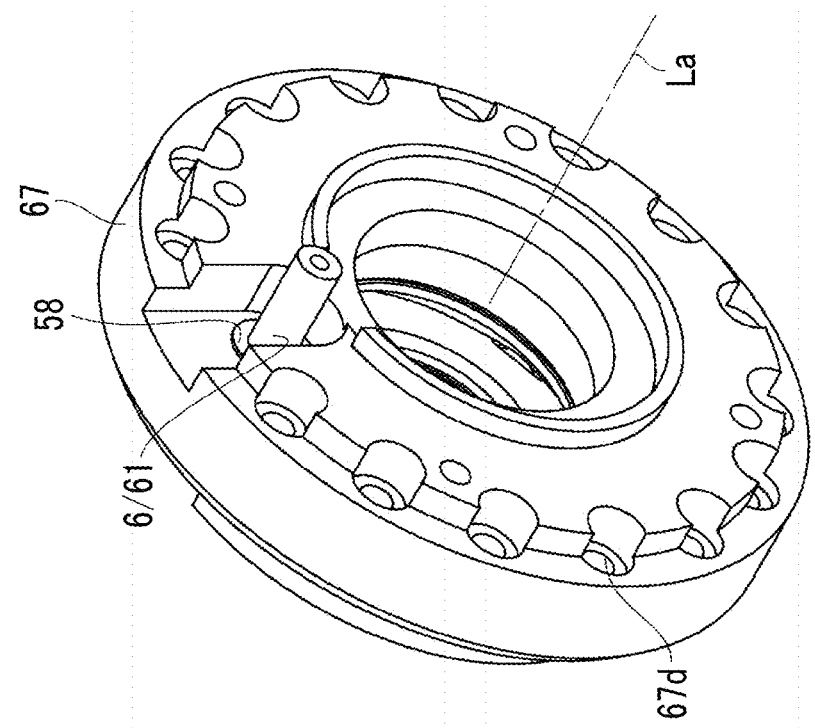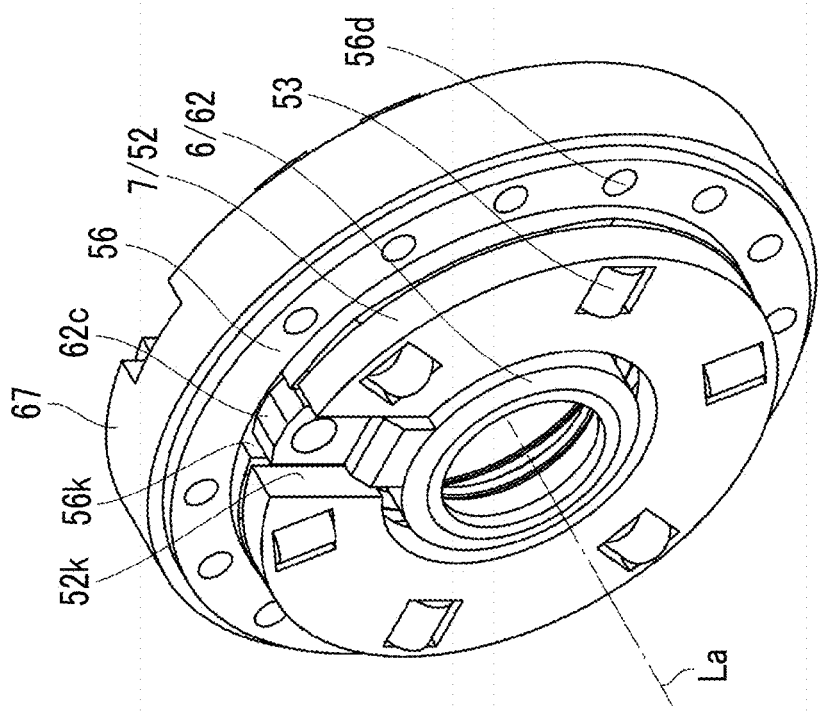

FRICTION TRANSMISSION DEVICE

CROSS-REFERENCE TO RELATED APPLICATIONS

This is a bypass continuation of International PCT Application No. PCT/JP2023/012904, filed on Mar. 29, 2023, which claims priority to Japanese Patent Application No. 2022-058090, filed on Mar. 31, 2022, which are incorporated by reference herein in their entirety.

BACKGROUND

Technical Field

A certain embodiment of the present invention relates to a friction transmission device.

Description of Related Art

A continuously variable transmission called an infinitely variable transmission (IVT) is known, in which an infinite speed change ratio is possible. The present applicant discloses, in the related art, a technique of a friction transmission device including an input trajectory ring, a planetary rolling body, and an output trajectory ring. In the device, the planetary rolling body is disposed about a rotation axis of the input trajectory ring and comes into contact with the input trajectory ring, and the output trajectory ring comes into contact with the planetary rolling body and is connected to an output shaft. In addition, the device includes a plurality of support trajectory rings that come into contact with the planetary rolling body and changes the speed of a rotation input to the input trajectory ring to output the rotation from the output shaft.

SUMMARY

According to an aspect of the present invention, there is provided a friction transmission device including an input trajectory ring, a planetary rolling body that is disposed about a rotation axis line of the input trajectory ring and that comes into contact with the input trajectory ring, an output trajectory ring that comes into contact with the planetary rolling body and that is connected to an output member, and a first support trajectory ring and a second support trajectory ring that come into contact with the planetary rolling body, in which at least one of the input trajectory ring, the output trajectory ring, the first support trajectory ring, or the second support trajectory ring is a convex-concave contact trajectory ring that comes into convex-concave contact with the planetary rolling body.

Any combination of the components described above and a combination obtained by switching the components and expressions of the present invention between methods, devices, and systems are also effective as an aspect of the present invention.

BRIEF DESCRIPTION OF THE DRAWINGS

FIGS. 5A and 5B are perspective views showing a planetary rolling body of the friction transmission device of FIG. 1.

FIGS. 11A and 11B are perspective views showing a pressing cam of the friction transmission device of FIG. 1.

FIGS. 13A and 13B are perspective views showing a cover of the friction transmission device of FIG. 1.

FIGS. 14A and 14B are perspective views showing a state where a predetermined member is mounted on the cover of FIGS. 13A and 13B.

DETAILED DESCRIPTION

It is expected that the friction transmission device is used in many applications such as a robot and a self-propelled bogie. In order for the friction transmission device to be used in more applications, it is desirable to lower a contact pressure between the planetary rolling body and a trajectory ring to extend the life thereof. However, in the friction transmission device of the related art, there is a limit to the expansion of a contact surface area, and thus it is difficult to reduce the contact pressure.

It is desirable to provide a friction transmission device that can further reduce a contact pressure.

Hereinafter, the present invention will be described based on a suitable embodiment with reference to each of the drawings. In the embodiment and modification examples, the same or equivalent components and members will be assigned with the same reference signs, and redundant description thereof will be omitted as appropriate. In addition, a dimension of a member in each drawing is shown by being enlarged or contracted as appropriate in order to facilitate understanding. In addition, some members that are not important for describing the embodiment will be omitted in each of the drawings.

In addition, although terms including ordinal numbers, such as first and second, are used in order to describe various components, the terms are used only for distinguishing one component from other components, and the terms do not limit the components.

Embodiment

Figure 1:
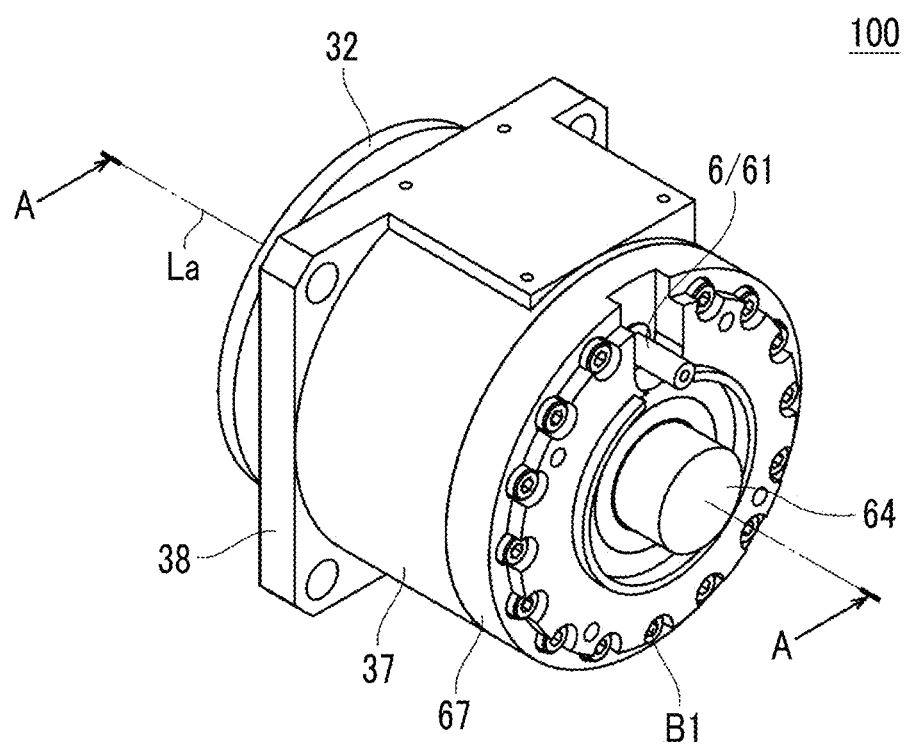
FIG. 1 is a perspective view showing an example of a friction transmission device according to an embodiment.
Figure 2:
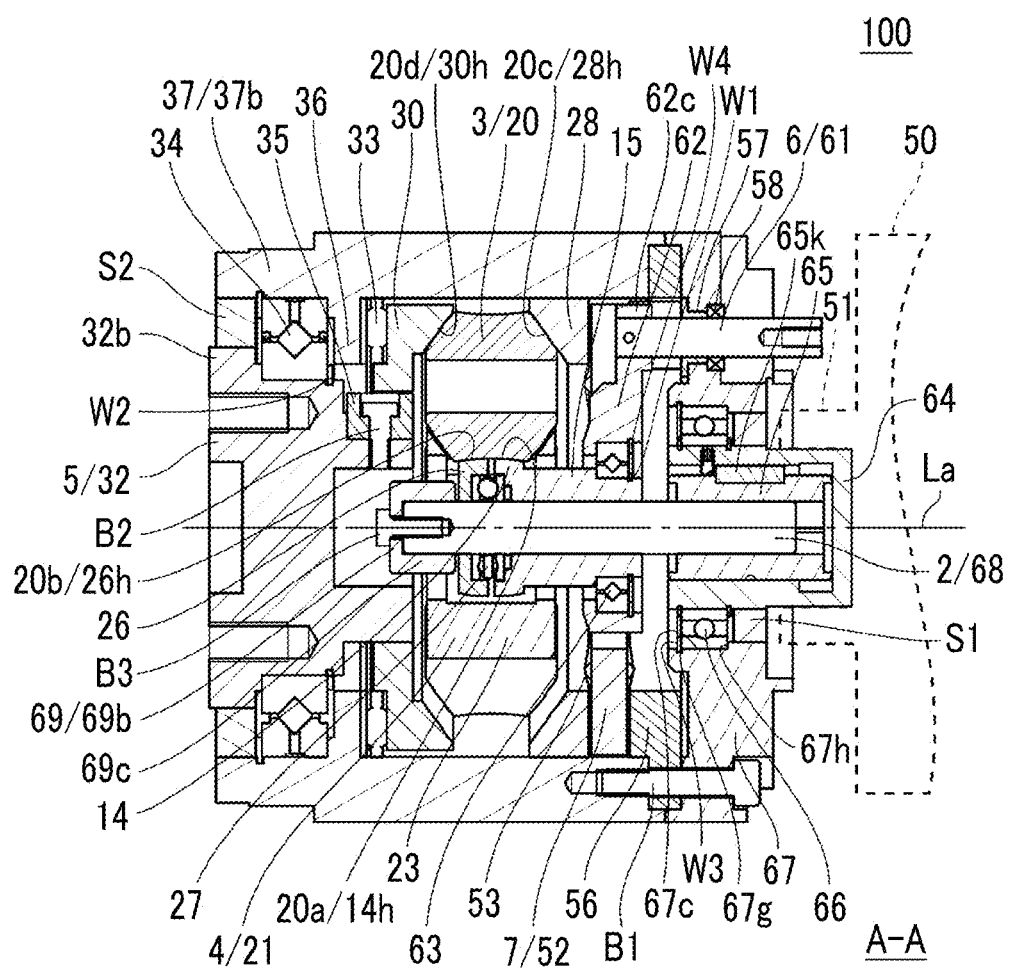
FIG. 2 is a sectional view showing a section taken along line A-A of the friction transmission device of FIG. 1.

First, an overall configuration of a friction transmission device 100 according to the embodiment of the present disclosure will be described. FIG. 1 is a perspective view showing an example of the friction transmission device 100 according to the embodiment. FIG. 2 is a sectional view showing a vertical section taken along line A-A of the friction transmission device 100. The friction transmission device 100 includes a casing 37 that surrounds an internal mechanism, an input shaft 64, an output member 32, and an attachment member 38. The attachment member 38 is a flange-shaped member provided on an outer periphery of the casing 37 in order to attach the friction transmission device 100 to an external device (not shown). FIG. 2 shows a state where the attachment member 38 is removed.

The friction transmission device 100 is configured to rotate an input trajectory ring with a rotation input to the input shaft 64, thereby causing a planetary rolling body to rotate and revolve, and to output the generated rotation component from the output member 32 connected to an output trajectory ring to a driven device (not shown).

The friction transmission device 100 mainly includes an input mechanism 2, a transmission mechanism 3, an output mechanism 5, a pressing force application mechanism 7, and a speed change ratio control mechanism 6. The input mechanism 2 is a mechanism that transmits a rotation input from a prime mover to an input trajectory ring 14. The transmission mechanism 3 is a mechanism that changes the speed of the rotation transmitted to the input trajectory ring 14 and that transmits the speed of the rotation to an output trajectory ring 30. The output mechanism 5 is a mechanism that outputs the rotation transmitted to the output trajectory ring 30 from the output member 32 to the driven device. The pressing force application mechanism 7 applies a pressing force in an axial direction to the transmission mechanism 3. The speed change ratio control mechanism 6 is a mechanism that controls a speed change ratio by changing a relative position of each trajectory ring of the transmission mechanism 3.

The input mechanism 2 will be described with reference to FIG. 2. The input mechanism 2 of the embodiment includes the input shaft 64, a ball spline nut 65, an input bearing 66, a cover 67, a first oil seal S1, a shaft 68, a shaft cap 69, the input trajectory ring 14, a sleeve 15, a first support trajectory ring 26, and a first trajectory ring bearing 27.

Hereinafter, a direction along a rotation axis line La of the input trajectory ring 14 will be referred to as an "axial direction", and a circumferential direction and a radial direction of a circle having the rotation axis line La as a center will be referred to as a "circumferential direction" and a "radial direction", respectively. In addition, hereinafter, for convenience, one side in the axial direction (right side in the drawing) will be referred to as an "input side", and the other side (left side in the drawing) will be referred to as a "counter-input side".

Unless otherwise specified, a circular portion surrounding the rotation axis line La of each member of the friction transmission device 100 is formed around the rotation axis line La. The centers of the circular portions may deviate from the rotation axis line La within a range of error.

The input shaft 64 is an input unit to which a rotation from the prime mover is input. The prime mover of the embodiment is a motor 50, and the input shaft 64 is connected to a motor shaft 51 to which a rotation of the motor 50 is output. The ball spline nut 65 transmits a rotation of the input shaft 64 to the shaft 68 and movably supports the shaft 68 in the axial direction. The input shaft 64 includes an outer cylinder that accommodates the ball spline nut 65. The ball spline nut 65 is key-connected to the input shaft 64 by a key 65k and rotates integrally with the input shaft 64. The shaft 68 is movable relative to the ball spline nut 65 in the axial direction and rotates integrally with the ball spline nut 65.

The cover 67 is a hollow disk-shaped member that covers the input side of the friction transmission device 100 and includes a hollow portion 67c surrounding the rotation axis line La. The cover 67 is fixed to the input side of the casing 37 by a plurality of bolts B1. The input bearing 66 is disposed between the hollow portion 67c and the ball spline nut 65 and rotatably supports the ball spline nut 65 and the input shaft 64 relative to each other. An outer ring of the input bearing 66 is supported by the hollow portion 67c, and an inner ring supports the ball spline nut 65. The input bearing 66 of this example is a ball bearing. The first oil seal S1 is disposed on the input side of the input bearing 66 in the hollow portion 67c and seals the input bearing 66.

The shaft 68 is a rod-shaped shaft extending in the axial direction and includes a groove (not shown) in the axial direction through which a ball passes. The input side of the shaft 68 is accommodated in the ball spline nut 65, and a tip of the shaft 68 extends to the counter-input side of a planetary rolling body 20. The shaft cap 69 is a member that restricts a positional relationship between the shaft 68 and the first support trajectory ring 26. The shaft cap 69 has a cup shape including a disk portion 69b and a cylindrical portion 69c extending from an outer periphery of the disk portion 69b to the input side. The tip of the shaft 68 is inserted into the cylindrical portion 69c and is fixed to the disk portion 69b by a bolt B3 penetrating the disk portion 69b.

Figure 3A:
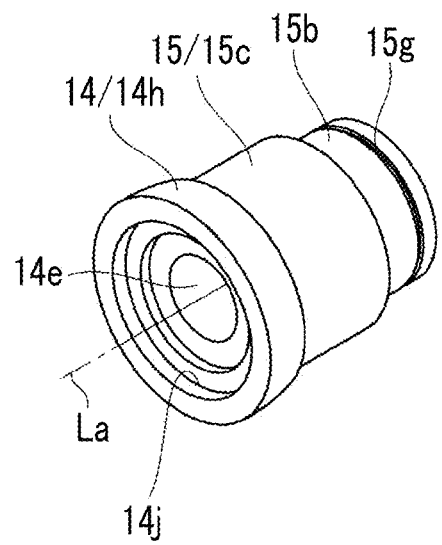
FIGS. 3A and 3B are perspective views showing an input trajectory ring of the friction transmission device of FIG. 1.
Figure 3B:
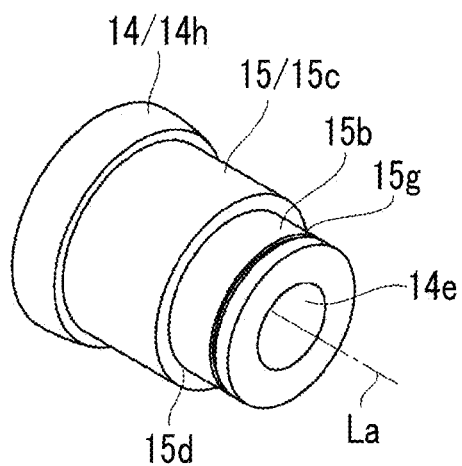

The input trajectory ring 14 will be described with reference to FIGS. 3A and 3B. In FIGS. 3A to 12B, 16A, and 16B, a view shown in (A) is a view when viewed obliquely from the counter-input side, and a view shown in (B) is a view when viewed obliquely from the input side. FIGS. 3A and 3B are perspective views showing the input trajectory ring 14. The input trajectory ring 14 of the example in FIGS. 3A and 3B is formed integrally with the sleeve 15.

The sleeve 15 is a hollow cylindrical member that is fixed to an outer periphery of the shaft 68 by being tightly fitted and the like and includes a first tubular portion 15b and a second tubular portion 15c from the input side toward the counter-input side. The first tubular portion 15b is surrounded by a control unit bearing 63 and is rotatably supported by the control unit bearing 63. A portion of the second tubular portion 15c having a larger diameter than that of the first tubular portion 15b is continuous with the first tubular portion 15b. A step portion 15d is formed at a boundary between the first tubular portion 15b and the second tubular portion 15c. A peripheral groove 15g in which a washer W1 for restricting a positional relationship with the control unit bearing 63 is mounted is provided around the first tubular portion 15b.

The input trajectory ring 14 is a hollow cylindrical member fixed to the outer periphery of the shaft 68, has a diameter larger than that of the second tubular portion 15c, and is continuous with the second tubular portion 15c. The input trajectory ring 14 is a hole into which the shaft 68 is fitted and includes a hollow portion 14e that penetrates from the counter-input side of the input trajectory ring 14 to the input side of the sleeve 15. A rolling contact surface 14h that comes into contact with the planetary rolling body 20 is provided on an outer periphery of the input trajectory ring 14. The input trajectory ring 14 includes a bearing accommodation unit 14j for accommodating a part of the first trajectory ring bearing 27 on the input side. The bearing accommodation unit 14j of this example is a circular recessed portion recessed from an end surface of the input trajectory ring 14 on the counter-input side to the input side.

The input trajectory ring 14 is a member that supports the planetary rolling body 20 in a predetermined posture and that is for transmitting a rotation to the planetary rolling body 20. The rolling contact surface 14h is a surface on which the planetary rolling body 20 rolls, and comes into point-contact or surface-contact with the planetary rolling body 20. The rolling contact surface 14h may be inclined with respect to the axial direction and the radial direction. The rolling contact surface 14h may include a tapered surface that is reduced in diameter toward the input side. The rolling contact surface 14h may be a curved surface such as a flat surface or a concave surface, but is a convex surface in this example.

Figure 4A:
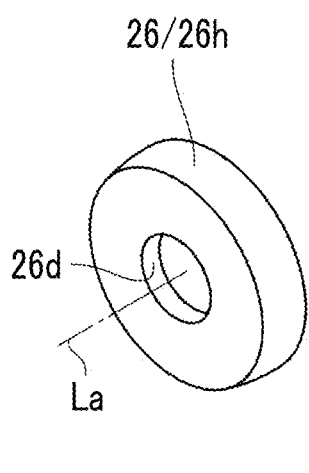
FIGS. 4A and 4B are perspective views showing a first support trajectory ring of the friction transmission device of FIG. 1.
Figure 4B:
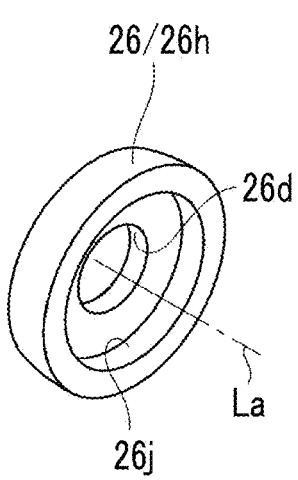

The first support trajectory ring 26 will be described with reference to FIGS. 4A and 4B. FIGS. 4A and 4B are perspective views showing the first support trajectory ring 26. The first support trajectory ring 26 is a cylindrical member that is fitted to the outer periphery of the shaft 68 and that is rotatably supported by the shaft 68 and is a hollow cylindrical member having substantially the same diameter as that of the input trajectory ring 14. The first support trajectory ring 26 includes a through-hole 26d surrounding the shaft 68. A rolling contact surface 26h that comes into contact with the planetary rolling body 20 is provided on an outer periphery of the first support trajectory ring 26. The first support trajectory ring 26 includes a bearing accommodation unit 26j for accommodating a part of the first trajectory ring bearing 27 on the counter-input side. The bearing accommodation unit 26j of this example is a circular recessed portion recessed from an end surface of the first support trajectory ring 26 on the input side to the counter-input side.

The first support trajectory ring 26 is a member for supporting the planetary rolling body 20 in a predetermined posture. The rolling contact surface 26h is a surface on which the planetary rolling body 20 rolls, and comes into point-contact or surface-contact with the planetary rolling body 20. The rolling contact surface 26h may be inclined with respect to the axial direction and the radial direction. The rolling contact surface 26h may include a tapered surface that is reduced in diameter toward the counter-input side. The rolling contact surface 26h may be a curved surface such as a flat surface or a concave surface, but is a convex surface in this example. The first support trajectory ring 26 is freely rotatable with respect to the shaft 68 and the planetary rolling body 20 and will be referred to as a free-wheeling trajectory ring in some cases.

The first trajectory ring bearing 27 is a thrust bearing that rotatably supports the first support trajectory ring 26 with respect to the input trajectory ring 14. For example, the first trajectory ring bearing 27 can be configured by two rings facing each other in the axial direction and a plurality of spheres interposed between the two rings.

The transmission mechanism 3 will be described with reference to FIGS. 2 and 5A to 9B. The transmission mechanism 3 of the embodiment includes a plurality of planetary rolling bodies 20, a holder 21, the input trajectory ring 14, the first support trajectory ring 26, a second support trajectory ring 28, and the output trajectory ring 30. When the input trajectory ring 14, the first support trajectory ring 26, the second support trajectory ring 28, and the output trajectory ring 30 are collectively referred to, they are referred to as a "trajectory ring".

FIGS. 5A and 5B are perspective views showing the planetary rolling body 20. The plurality of (for example, five) planetary rolling bodies 20 are disposed at a predetermined interval in the circumferential direction. The number of the planetary rolling bodies 20 is not particularly limited and may be less than or more than five, but is preferably 5 to 12. The planetary rolling body 20 includes a contact surface 20a that comes into contact with the rolling contact surface 14h of the input trajectory ring 14, a contact surface 20b that comes into contact with the rolling contact surface 26h of the first support trajectory ring 26, a contact surface 20c that comes into contact with a rolling contact surface 28h of the second support trajectory ring 28, and a contact surface 20d that comes into contact with a rolling contact surface 30h of the output trajectory ring 30.

When the rolling contact surfaces 14h, 26h, 28h, and 30h of the trajectory rings are collectively referred to, they are referred to as rolling contact surfaces of the trajectory rings. When the contact surfaces 20a, 20b, 20c, and 20d are collectively referred to, they are referred to as the contact surfaces of the planetary rolling body. The contact surfaces 20a and 20b may be flat surfaces or convex surfaces, but are concave surfaces in this example. The contact surfaces 20c and 20d may be flat surfaces or concave surfaces, but are convex surfaces in this example.

The planetary rolling body 20 is restricted in an axial position, a radial position, and a posture by coming into contact with the rolling contact surfaces of the trajectory rings. The shape of the planetary rolling body 20 may be any shape insofar as the posture is determined by coming into contact with the rolling contact surfaces of the trajectory rings and the planetary rolling body 20 can roll while coming into contact with the rolling contact surfaces of the trajectory rings. As shown in FIGS. 5A and 5B, the planetary rolling body 20 of the embodiment is a rotating body obtained by rotating a trapezoid in which an upper base and legs are curves about a predetermined axis line. The predetermined axis line is an axis line that is separated to an opposite upper base side of a lower base of the trapezoid and that is parallel to the lower base. In addition, in the present specification, a plane passing through the center of the upper base of the trapezoid and that is perpendicular to a rotation axis Lb of the planetary rolling body 20 (hereinafter, referred to as an "equatorial plane") and an outer peripheral surface of the planetary rolling body 20 intersect each other to form a circle, which is referred to as an "equator". In this example, an equator 20e is a circle formed as the equatorial plane and the outer peripheral surface of the planetary rolling body 20 intersect each other.

An inclination of the rotation axis Lb of the planetary rolling body 20 with respect to the rotation axis line La changes depending on relative positions of the rolling contact surfaces of the trajectory rings. That is, the rotation axis Lb may be parallel to the rotation axis line La or may be inclined with respect to the rotation axis line La in some cases.

Figure 6A:
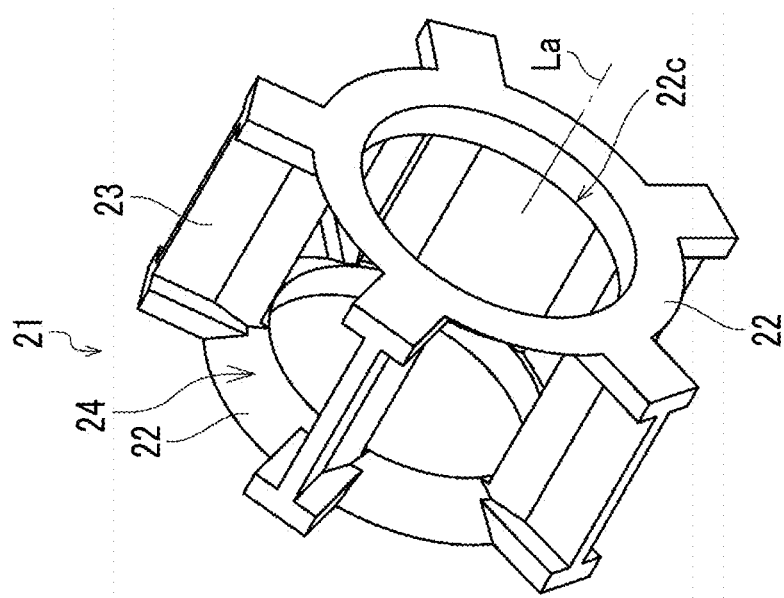
FIGS. 6A and 6B are perspective views showing a holder of the friction transmission device of FIG. 1.
Figure 6B:
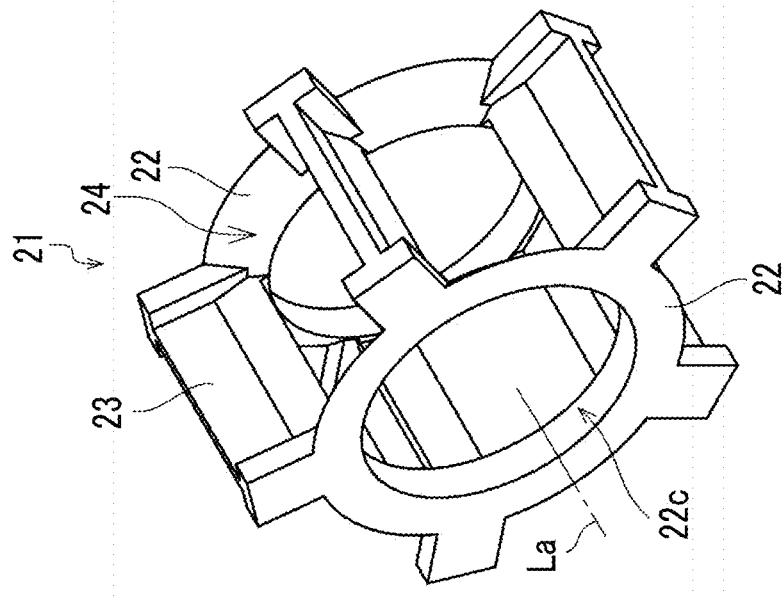

FIGS. 6A and 6B are perspective views showing the holder 21. The friction transmission device 100 of the embodiment includes the holder 21 for holding the plurality of planetary rolling bodies 20 at desired positions. The holder 21 restricts movements of the plurality of planetary rolling bodies 20 in the circumferential direction. The holder 21 holds the plurality of planetary rolling bodies 20 at a predetermined interval in the circumferential direction to avoid contact between the planetary rolling bodies 20. The holder 21 includes two ring portions 22 and a plurality (for example, five) of pillar portions 23. The ring portions 22 and the pillar portions 23 of the holder 21 can be integrally formed of a resin or a metal.

The two ring portions 22 are disposed to be separated from each other in the axial direction with the planetary rolling body 20 interposed therebetween. Each of the ring portions 22 is a hollow annular portion including a center hole 22c. The plurality of pillar portions 23 are strip-shaped members extending in the axial direction and are disposed between the plurality of planetary rolling bodies 20 at a predetermined interval in the circumferential direction. The pillar portion 23 includes one end fixed to an outer periphery of one ring portion 22 and the other end fixed to an outer periphery of the other ring portion 22. That is, the pillar portion 23 bridges between the two ring portions 22. A pocket 24 for holding the planetary rolling body 20 is formed between the two pillar portions 23 adjacent to each other.

Figure 7A:
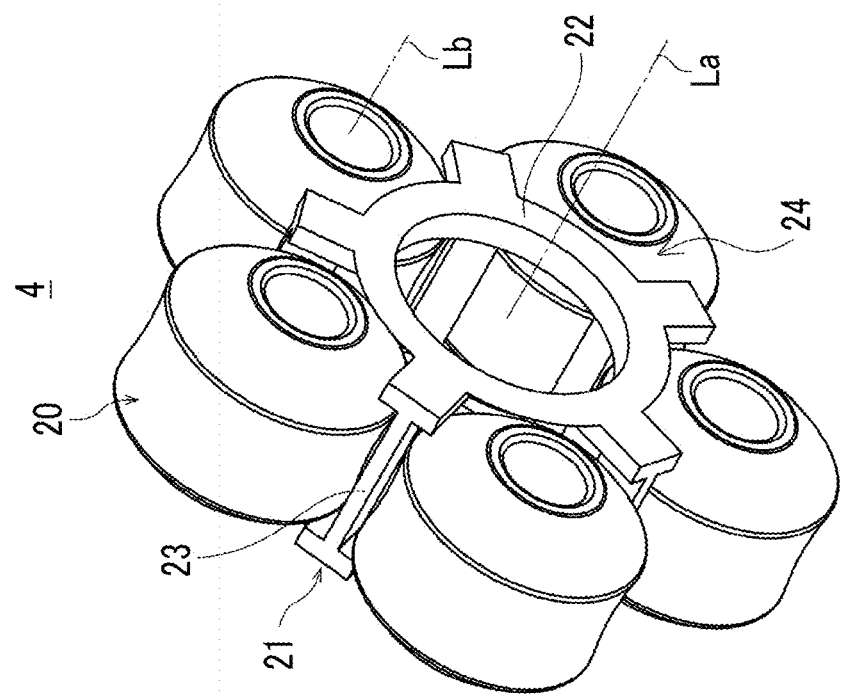
FIGS. 7A and 7B are perspective views showing a planetary rolling body unit of the friction transmission device of FIG. 1.
Figure 7B:
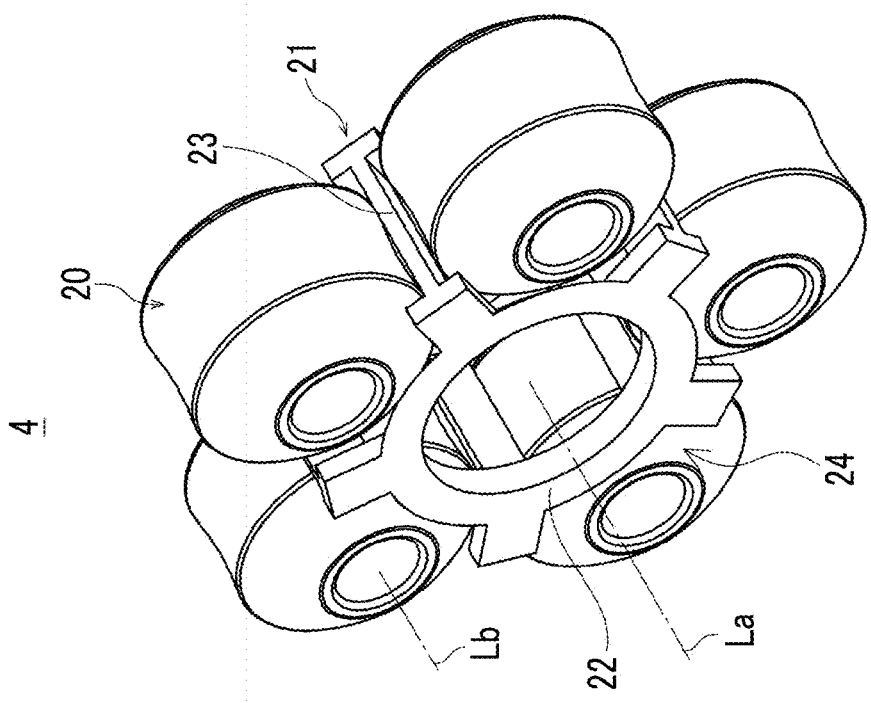

FIGS. 7A and 7B are perspective views showing a planetary rolling body unit 4. As shown in FIGS. 7A and 7B, the plurality of planetary rolling bodies 20 are incorporated into the respective pockets 24 of the holder 21 to configure the planetary rolling body unit 4. The planetary rolling body 20 is held to be rotatable in the pocket 24.

Figure 8A:
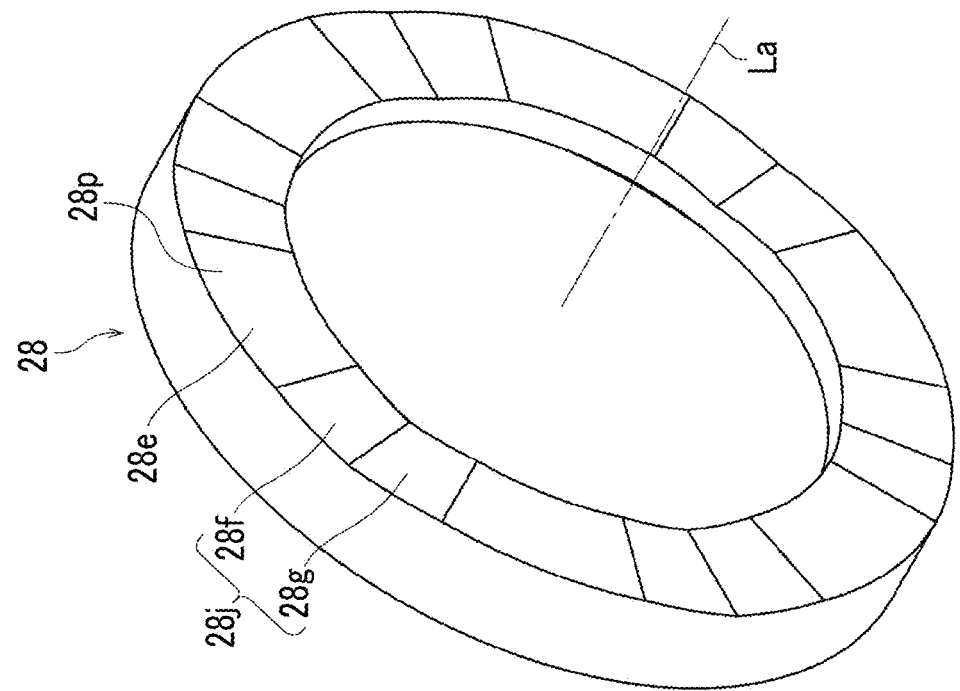
FIGS. 8A and 8B are perspective views showing a second support trajectory ring of the friction transmission device of FIG. 1.
Figure 8B:
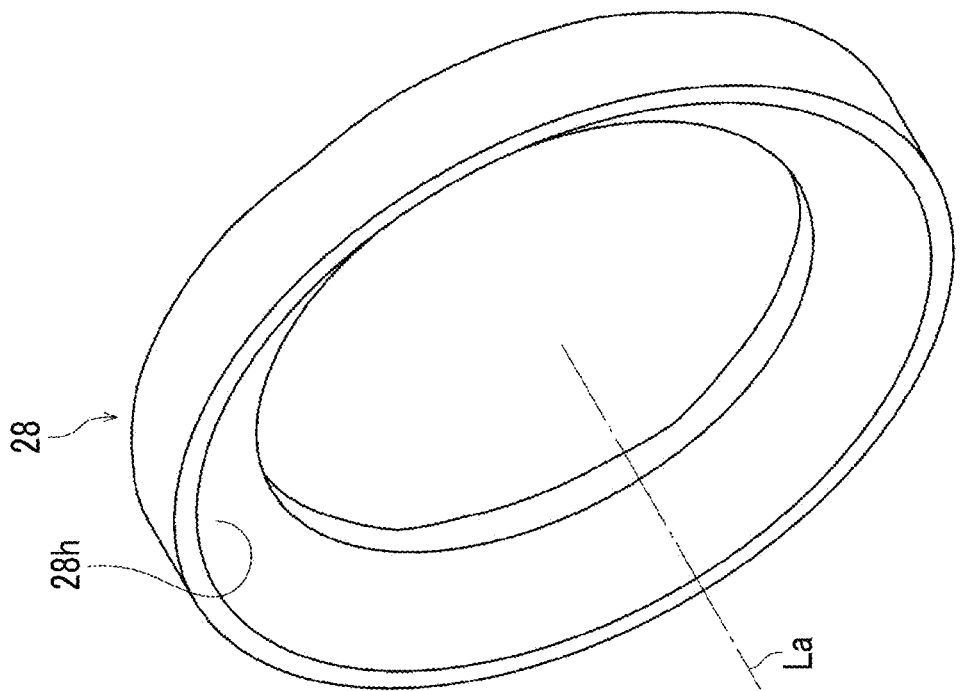

FIGS. 8A and 8B are perspective views showing the second support trajectory ring 28. The second support trajectory ring 28 has a ring shape surrounding the sleeve 15 and the planetary rolling body 20. The second support trajectory ring 28 includes the rolling contact surface 28h on the counter-input side and includes a cam surface 28p on the input side. The rolling contact surface 28h is a surface on which the planetary rolling body 20 rolls, and comes into point-contact or surface-contact with the planetary rolling body 20. The rolling contact surface 28h is inclined with respect to the axial direction and the radial direction. The rolling contact surface 28h includes a tapered surface that is reduced in diameter toward the input side. The rolling contact surface 28h of this example is a conical surface configured by a flat surface.

The cam surface 28p includes a plurality (for example, six) of concave cam grooves 28j each including a first inclined surface 28f and a second inclined surface 28g. The cam groove 28j has a V-shape when viewed in the radial direction from an outer diameter side. The plurality of cam grooves 28j are disposed at a predetermined interval in the circumferential direction and are connected to each other by a connection surface 28e. The connection surface 28e can be formed to be parallel to a plane perpendicular to the rotation axis line La. The first inclined surface 28f is inclined with respect to the plane perpendicular to the rotation axis line La. The second inclined surface 28g is inclined in a direction opposite to the first inclined surface 28f with respect to the plane perpendicular to the rotation axis line La.

The second support trajectory ring 28 is fitted to an inner peripheral surface of the casing 37 to be slidable in the axial direction. A pressing force from the cam surface 28p to the counter-input side in the axial direction is applied to the second support trajectory ring 28 by the pressing force application mechanism 7. The pressing force presses the planetary rolling body 20 against the output trajectory ring 30.

Figure 9A:
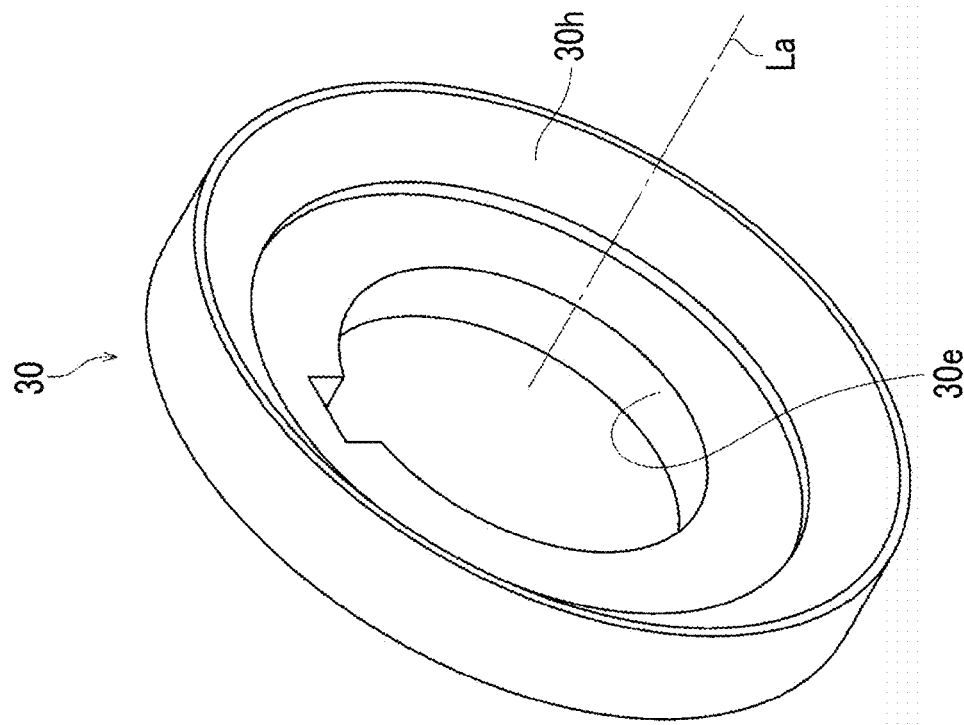
FIGS. 9A and 9B are perspective views showing an output trajectory ring of the friction transmission device of FIG. 1.
Figure 9B:
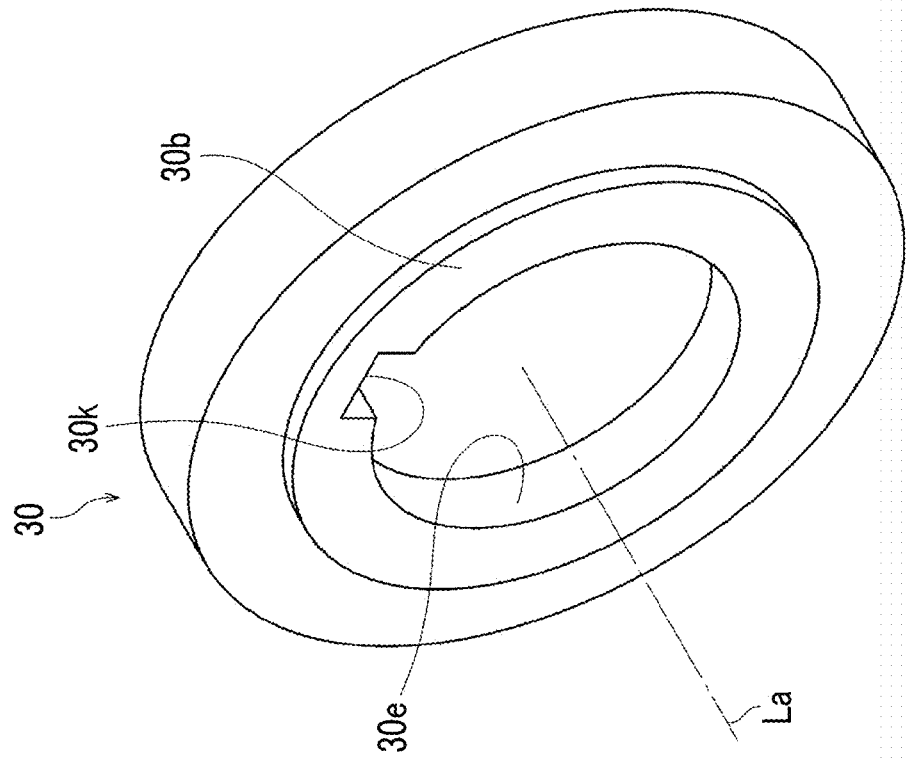

FIGS. 9A and 9B are perspective views showing the output trajectory ring 30. The output trajectory ring 30 has a ring shape surrounding the shaft 68 and the shaft cap 69. The output trajectory ring 30 includes the rolling contact surface 30h on the input side. The rolling contact surface 30h is a surface on which the planetary rolling body 20 rolls, and comes into point-contact or surface-contact with the planetary rolling body 20. The rolling contact surface 30h is inclined with respect to the axial direction and the radial direction. The rolling contact surface 30h includes a tapered surface that is reduced in diameter toward the counter-input side. The rolling contact surface 30h of this example is a conical surface configured by a flat surface.

The output trajectory ring 30 comes into contact with the planetary rolling body 20 and rotates about the rotation axis line La as the planetary rolling body 20 rotates. The output trajectory ring 30 is connected to an output member 32 of the output mechanism 5, and the output member 32 rotates as the output trajectory ring 30 rotates. The output trajectory ring 30 includes a connecting hole 30e surrounding the rotation axis line La and penetrating in the axial direction. A connecting portion 32d of the output member 32 is fitted into the connecting hole 30e. The connecting hole 30e is provided with a recessed portion 30k that meshes with a parallel key 35 provided on an outer periphery of the connecting portion 32d. The output trajectory ring 30 is provided with a circular protruding portion 30b that protrudes to the counter-input side.

An operation of the transmission mechanism 3 will be described. When the input trajectory ring 14 rotates, the planetary rolling body 20 revolves around a revolution axis while rotating about the rotation axis Lb. In this example, since the revolution axis of the planetary rolling body 20 matches the rotation axis line La, hereinafter, the rotation axis line La will be described as the revolution axis.

In a case where the first support trajectory ring 26 freely rotates and the second support trajectory ring 28 is stationary without rotating, an output rotation obtained by multiplying an input rotation by a speed change ratio R is output to the output trajectory ring 30. The speed change ratio R is determined according to the shape of the planetary rolling body 20 and an inclination of the rotation axis Lb with respect to the rotation axis line La. Therefore, the speed change ratio R can be changed by changing the inclination of the rotation axis Lb. The embodiment includes the speed change ratio control mechanism 6 in order to change the speed change ratio R by changing the inclination of the rotation axis Lb. The speed change ratio control mechanism 6 will be described later.

The output mechanism 5 will be described with reference to FIGS. 2, 10A, and 10B. As shown in FIG. 2, the output mechanism 5 includes the output trajectory ring 30, an output trajectory ring bearing 33, the output member 32, an output bearing 34, a second oil seal S2, and the casing 37. The casing 37 functions as an outer shell that surrounds the internal mechanism of the friction transmission device 100. The casing 37 includes a tubular portion 37b and an inner extension portion 36. The cover 67 is fixed to the input side of the tubular portion 37b with a pressing cam 56 interposed therebetween. The inner extension portion 36 is a ring-shaped portion that extends inward in the radial direction from an inner peripheral side of the tubular portion 37b. The output bearing 34 is accommodated on the counter-input side of the inner extension portion 36 of the tubular portion 37b.

The output bearing 34 is disposed between the output member 32 and the tubular portion 37b, and the input side of the output bearing 34 is supported by the inner extension portion 36. The output bearing 34 rotatably supports the output member 32. The output bearing 34 of this example is a cross roller bearing. An outer ring of the output bearing 34 is supported by the tubular portion 37b, and an inner ring supports the output member 32.

The second oil seal S2 is disposed on the counter-input side of the output bearing 34 on an inner peripheral surface of the tubular portion 37b and seals between the inside and the outside of the friction transmission device 100.

The output trajectory ring bearing 33 rotatably supports the output trajectory ring 30 with respect to the inner extension portion 36 of the casing 37. The output trajectory ring bearing 33 is disposed between the inner extension portion 36 and the output trajectory ring 30 in the axial direction. The output trajectory ring bearing 33 has a ring shape accommodated in an annular space between the tubular portion 37b and the circular protruding portion 30b of the output trajectory ring 30. That is, the output trajectory ring bearing 33 is fitted to an outer periphery of the circular protruding portion 30b. The output trajectory ring bearing 33 of this example is a thrust bearing including a ring and a plurality of rollers rolling on the ring.

Figure 10A:
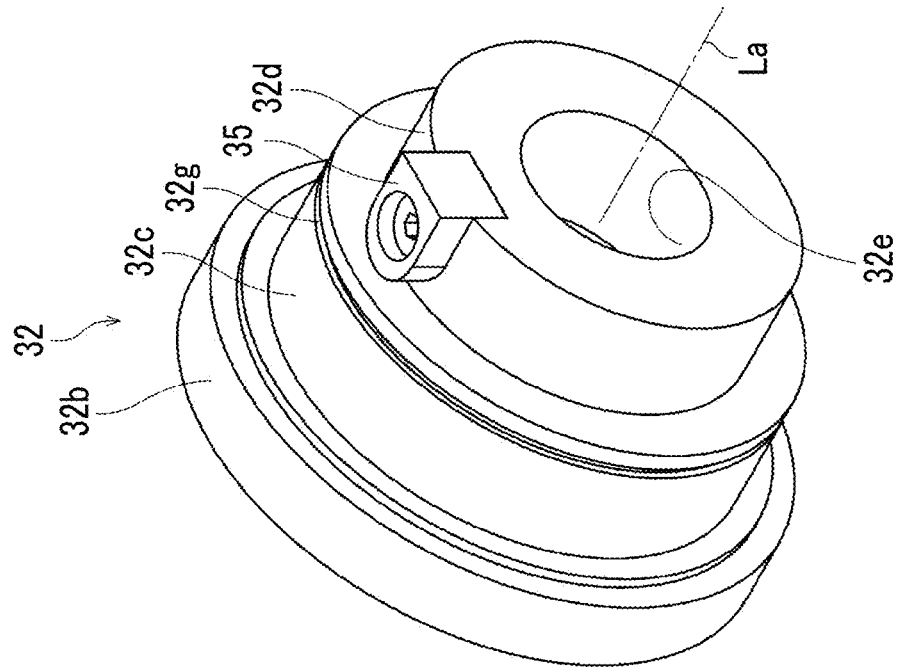
FIGS. 10A and 10B are perspective views showing an output member of the friction transmission device of FIG. 1.
Figure 10B:
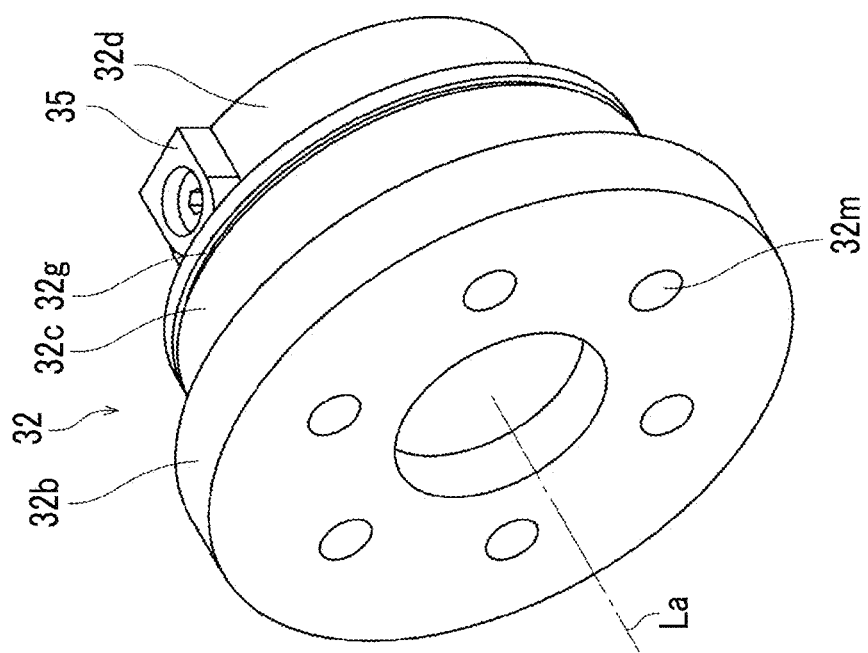

FIGS. 10A and 10B are perspective views showing the output member 32. The output member 32 is a substantially circular member as a whole and includes a flange portion 32b, an intermediate portion 32c, and the connecting portion 32d in order from the counter-input side. The flange portion 32b is a disk-shaped portion and includes a plurality (for example, six) of tapped holes 32m for being bolted to the driven device on the counter-input side. The plurality of tapped holes 32m are disposed at a predetermined interval on a circumference surrounding the rotation axis line La.

The intermediate portion 32c is a circular portion that is continuous with the input side of the flange portion 32b and that has a diameter smaller than that of the flange portion 32b. A peripheral groove 32g in which a washer W2 for restricting a positional relationship with the output bearing 34 is mounted is provided around an outer periphery of the intermediate portion 32c. The intermediate portion 32c is supported by the output bearing 34.

The connecting portion 32d is a circular portion that is continuous with the input side of the intermediate portion 32c and that has a smaller diameter than that of the intermediate portion 32c. The parallel key 35 for fixing is fixed to the outer periphery of the connecting portion 32d by a bolt B2. The parallel key 35 meshes with the recessed portion 30k of the connecting hole 30e. The output member 32 is connected to the output trajectory ring 30 in a state where the connecting portion 32d is fitted into the connecting hole 30e. In this state, the output member 32 and the output trajectory ring 30 are movable relative to each other in the axial direction and integrally rotate in the circumferential direction. A circular recessed portion 32e recessed to the counter-input side in the axial direction is provided on the input side of the connecting portion 32d. The circular recessed portion 32e is a circular recessed portion surrounding the rotation axis line La and has an inner diameter and a depth capable of accommodating the tip of the shaft 68 and the shaft cap 69 via a gap.

The pressing force application mechanism 7 will be described with reference to FIGS. 2, 11A, 11B, 12A, 12B, 13A, 13B, 14A, 14B, 15A, and 15B. The pressing force application mechanism 7 converts rotating motion of the second support trajectory ring 28 into linear motion of the second support trajectory ring 28 to apply a preload to the transmission mechanism 3. As shown in FIG. 2, the pressing force application mechanism 7 includes the pressing cam 56, a roller holder 52, a roller 53, the cover 67, and the second support trajectory ring 28. FIGS. 11A and 11B are perspective views showing the pressing cam 56. The pressing cam 56 is a ring-shaped member including a through-hole 56c and is disposed between the tubular portion 37b and the cover 67. The pressing cam 56 includes a plurality of bolt holes 56d for passing the bolts B1. The plurality of bolt holes 56d are disposed at a predetermined interval in the circumferential direction at positions offset from the rotation axis line La. The pressing cam 56 includes a notch portion 56k in which a part in the circumferential direction is cut out in order to allow a control shaft 61 of the speed change ratio control mechanism 6 to penetrate therethrough.

The pressing cam 56 includes a cam surface 56p on the counter-input side. The cam surface 56p includes a plurality (for example, six) of concave cam grooves 56j each including a first inclined surface 56f and a second inclined surface 56g. The cam grooves 56j each have a V-shape when viewed in the radial direction from the outer diameter side. The plurality of cam grooves 56j are disposed at a predetermined interval in the circumferential direction and are connected to each other by a connection surface 56e. The connection surface 56e can be formed to be parallel to the plane perpendicular to the rotation axis line La. The first inclined surface 56f is inclined with respect to the plane perpendicular to the rotation axis line La. The second inclined surface 56g is inclined in a direction opposite to the first inclined surface 56f with respect to the plane perpendicular to the rotation axis line La.

Figure 12A:
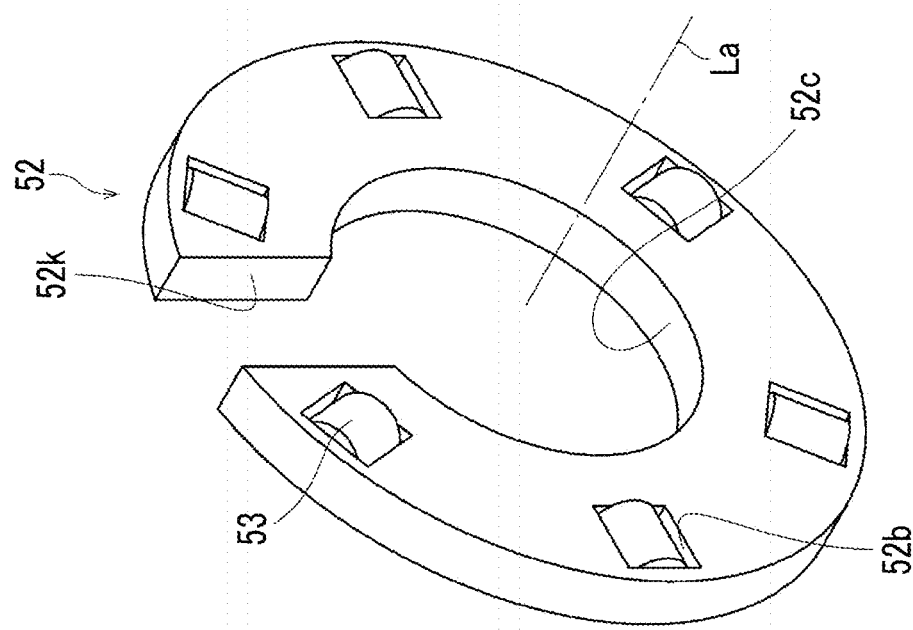
FIGS. 12A and 12B are perspective views showing a roller holder of the friction transmission device of FIG. 1.
Figure 12B:
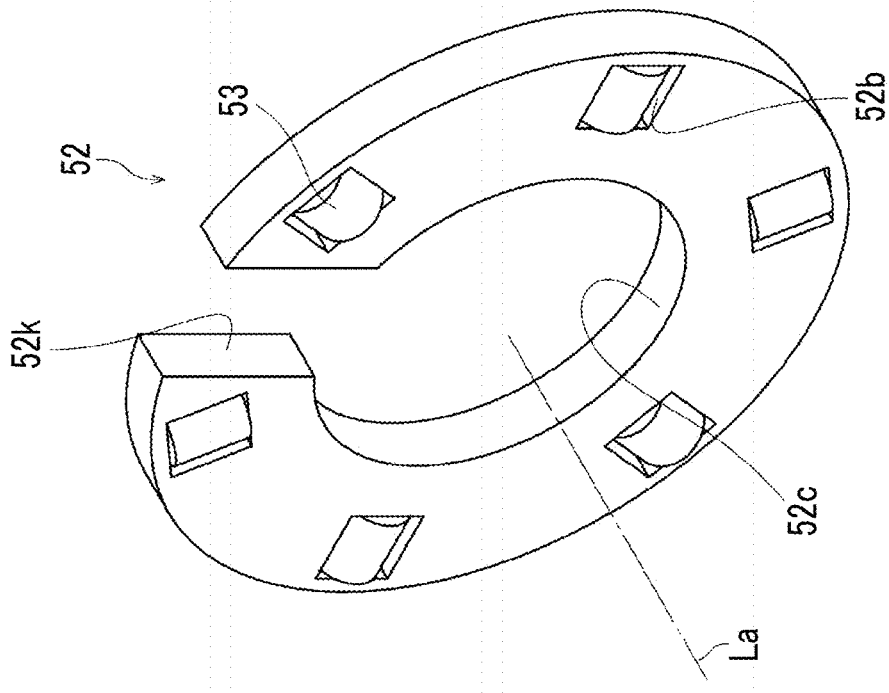

FIGS. 12A and 12B are perspective views showing the roller 53 and the roller holder 52. The roller holder 52 is a ring-shaped member including a through-hole 52c and is disposed between the cam surface 28p of the second support trajectory ring 28 and the cam surface 56p of the pressing cam 56. The roller holder 52 has a plurality of (for example, six) pockets 52b disposed at a predetermined interval in the circumferential direction. Each of the pockets 52b is a rectangular hole when viewed in the axial direction. A plurality of (for example, six) rollers 53 are provided to correspond to the cam grooves 56j. The rollers 53 each have a cylindrical shape and are rotatably accommodated in the pockets 52b. The roller holder 52 includes a notch portion 52k in which a part in the circumferential direction is cut out in order to allow the control shaft 61 of the speed change ratio control mechanism 6 to penetrate therethrough.

FIGS. 13A and 13B are perspective views showing the cover 67. The cover 67 is a hollow disk-shaped member including the hollow portion 67c surrounding the rotation axis line La and is fixed to the input side of the casing 37. The cover 67 includes a plurality of bolt holes 67d for passing the bolts B1. The plurality of bolt holes 67d are disposed at a predetermined interval in the circumferential direction at positions offset from the rotation axis line La and communicate with the bolt holes 56d of the pressing cam 56. The cover 67 includes a through-hole 67e for allowing the control shaft 61 to penetrate therethrough. The through-hole 67e is disposed at a position offset from the rotation axis line La and is disposed on the inner peripheral side of a pitch circle of the bolt holes 67d.

A sleeve bearing 57 and a cylindrical seal 58 are mounted on the through-hole 67e (also see FIG. 2). The sleeve bearing 57 includes a plate-shaped flange portion that is in contact with the counter-input side of the cover 67 and a cylindrical portion that is fitted to the through-hole 67e, and can be formed of, for example, a sintered metal. The sleeve bearing 57 smooths an axial movement of the control shaft 61 and suppresses an outflow of a lubricant. The cylindrical seal 58 is disposed on the input side of the sleeve bearing 57 in the through-hole 67e and functions as an oil seal that suppresses the outflow of the lubricant.

A peripheral step portion 67h that is in contact with the input side of the input bearing 66 and a peripheral groove 67g on which a washer W3 is mounted are provided around the hollow portion 67c. The washer W3 that comes into contact with the counter-input side of the input bearing 66 is mounted on the peripheral groove 67g. The axial position of the input bearing 66 is restricted by the washer W3 and the peripheral step portion 67h.

FIGS. 14A and 14B are perspective views showing a state where main members of the speed change ratio control mechanism 6 and the pressing force application mechanism 7 are mounted on the cover 67. The pressing cam 56 and the roller holder 52 are mounted to be stacked on the counter-input side of the cover 67. In this state, the notch portion 56k and the notch portion 52k are aligned with the through-hole 67e in the circumferential direction. In addition, a control ring 62 is mounted such that a radial extension portion 62c (also see FIGS. 16A and 16B) is accommodated in the notch portion 56k and the notch portion 52k. In addition, the control ring 62 is accommodated in a central space of the pressing cam 56 and the roller holder 52, and the control shaft 61 penetrates central holes of the sleeve bearing 57 and the cylindrical seal 58 and protrudes from the input side of the cover 67.

Figure 15A:
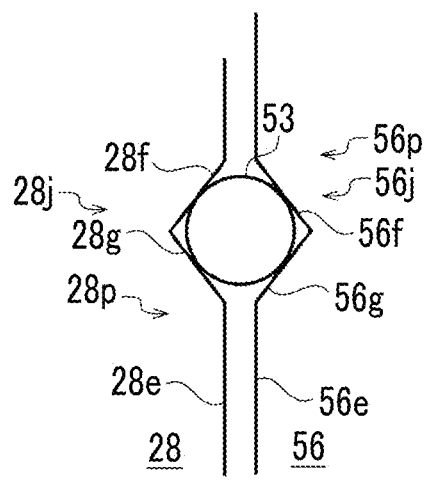
FIGS. 15A and 15B are schematic views for describing an operation of a pressing force application mechanism of the friction transmission device of FIG. 1.
Figure 15B:
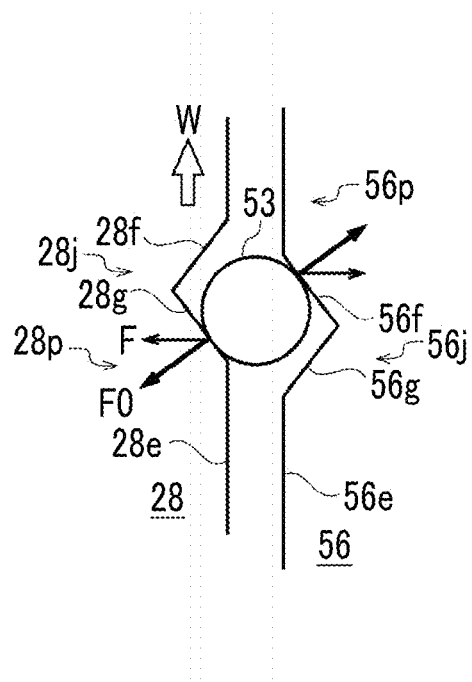

FIGS. 15A and 15B are views for schematically describing an operation of the pressing force application mechanism 7 and shows the cam surface 28p, the roller 53, and the cam surface 56p. The pressing cam 56 is fixed to the casing to be stationary, and the second support trajectory ring 28 rotates by receiving a rotation force (torque) as the planetary rolling body 20 rotates. FIG. 15A shows a state where the rotation force is not received, and FIG. 15B shows a state where the rotation force is received.

When the second support trajectory ring 28 rotates, as shown in FIG. 15B, relative positions of the cam groove 28j and the cam groove 56j are deviated from each other as shown by an arrow W, and the roller 53 rides on the first inclined surface 56f and the second inclined surface 28g. As a result, a resistance F0 from the roller 53 is added to the inclined surface, and a component force of the resistance F0 becomes a pressing force F, so that the second support trajectory ring 28 is pressed to the counter-input side. The pressing force F presses the second support trajectory ring 28, the planetary rolling body 20, the output trajectory ring 30, and the output trajectory ring bearing 33 against the inner extension portion 36 to function as a preload of the transmission mechanism 3 (also see FIG. 2).

When a load from the driven device increases and the preload between the output trajectory ring 30 and the planetary rolling body 20 is insufficient, the proportion of a rotation force that is input from the input trajectory ring 14 to the planetary rolling body 20 and that is transmitted to the second support trajectory ring 28 increases. When a rotation force of the second support trajectory ring 28 increases, the pressing force F, which is a component force of the rotation force of the second support trajectory ring 28, increases, and the preload increases. When the load from the driven device decreases, the rotation force transmitted to the second support trajectory ring 28 decreases by a reverse mechanism, and the pressing force F and the preload also decrease. As described above, with the pressing force application mechanism 7, the pressing force F corresponding to the load from the driven device is applied to the transmission mechanism 3, and the preload can be automatically adjusted.

Figure 16A:
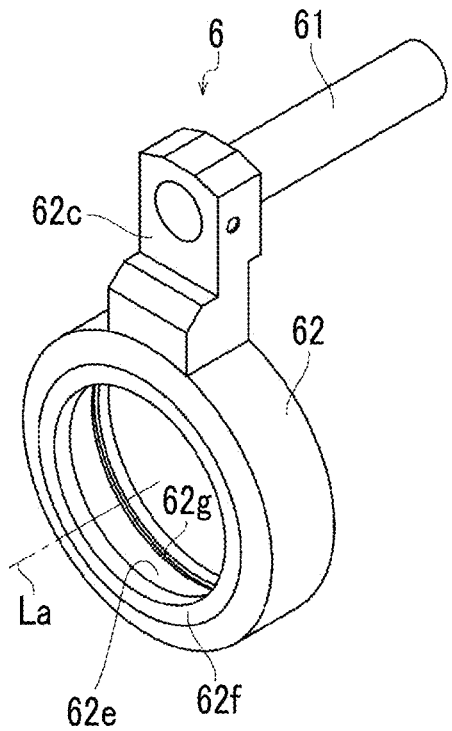
FIGS. 16A and 16B are perspective views showing a speed change ratio control mechanism of the friction transmission device of FIG. 1.
Figure 16B:
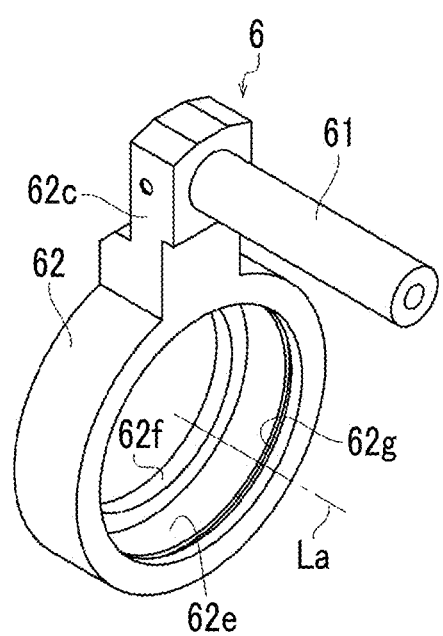

The speed change ratio control mechanism 6 will be described with reference to FIGS. 2, 16A, and 16B. FIGS. 16A and 16B are perspective views showing the speed change ratio control mechanism 6. As described above, the speed change ratio control mechanism 6 is a mechanism that controls the speed change ratio R by changing the relative position of the input trajectory ring 14 of the transmission mechanism 3. As shown in FIG. 2, the speed change ratio control mechanism 6 includes the control shaft 61, the control ring 62, and the control unit bearing 63. The control shaft 61 is a rod-shaped member extending in the axial direction at a position offset from the rotation axis line La in the radial direction, and a counter-input side end thereof is attached to the radial extension portion 62c of the control ring 62. A radial position of the control shaft 61 may be a position offset outward in the radial direction from the input shaft 64 or may be a position offset outward in the radial direction from the input trajectory ring 14. The control ring 62 is a ring-shaped member including a hollow portion 62e. In order to support the control unit bearing 63, a peripheral extending portion 62f in which a counter-input side portion of the hollow portion 62e extends inward in the radial direction and a peripheral groove 62g in which a washer W4 is mounted are provided around the hollow portion 62e. The movement of the control unit bearing 63 in the axial direction is restricted by the peripheral extending portion 62f and the washer W4.

The control unit bearing 63 is disposed between the hollow portion 62e of the control ring 62 and the first tubular portion 15b of the sleeve 15. The control unit bearing 63 rotatably supports the sleeve 15 with respect to the speed change ratio control mechanism 6. An outer ring of the control unit bearing 63 is supported by the hollow portion 62e of the control ring 62, and an inner ring supports the first tubular portion 15b. The control unit bearing 63 of this example is a cross roller bearing. The control shaft 61 extends from the radial extension portion 62c to the input side, penetrates the pressing cam 56 and the cover 67, and protrudes to the input side of the cover 67. The control shaft 61 is connected to an actuator (not shown) that outputs a driving force in the axial direction. The counter-input side of the control ring 62 is accommodated in the through-hole 52c of the roller holder 52.

An operation of the speed change ratio control mechanism 6 will be described. When a driving force in the axial direction is input from the actuator to the control shaft 61, the control ring 62 moves in the axial direction. In conjunction with the movement of the control ring 62, the control unit bearing 63, the sleeve 15, the input trajectory ring 14, the first trajectory ring bearing 27, the first support trajectory ring 26, the shaft 68, and the shaft cap 69 integrally move. In this case, since the second support trajectory ring 28 and the output trajectory ring 30 are stationary in the axial direction, the rotation axis Lb of the planetary rolling body 20 is inclined with respect to the rotation axis line La.

When the input trajectory ring 14 and the first support trajectory ring 26 move to the counter-input side, the counter-input side of the rotation axis Lb is inclined to be away from the rotation axis line La, and the input side of the rotation axis Lb is inclined to be close to the rotation axis line La. As a result, a rotation radius and a revolution radius of each contact point between each trajectory ring and the planetary rolling body 20 change, and the speed change ratio R also changes. The speed change ratio R (output rotation/input rotation) of the friction transmission device 100 increases as the inclination with respect to the rotation axis line La increases. Similarly, when the input trajectory ring 14 and the first support trajectory ring 26 move to the input side, the rotation axis Lb is inclined to the opposite side, and the speed change ratio R of the friction transmission device 100 decreases as the inclination with respect to the rotation axis line La increases. By holding the position of the control shaft 61 constant, the posture of the planetary rolling body 20 is held constant, and the speed change ratio R is kept constant.

An operation of the friction transmission device 100 configured as described above will be described. When a rotation is transmitted from the motor shaft 51 to the input shaft 64, the input trajectory ring 14 rotates about the rotation axis line La. The input trajectory ring 14 rotates, so that the planetary rolling body 20 rotates and revolves. The rotation of the planetary rolling body 20 is transmitted to the output trajectory ring 30, and the output trajectory ring 30 rotates at a speed corresponding to the speed change ratio R. The rotation of the output trajectory ring 30 is output to the output member 32 through the output mechanism 5. When positions of the input trajectory ring 14 and the first support trajectory ring 26 are changed by the speed change ratio control mechanism 6, the speed change ratio R also changes.

Figure 17:
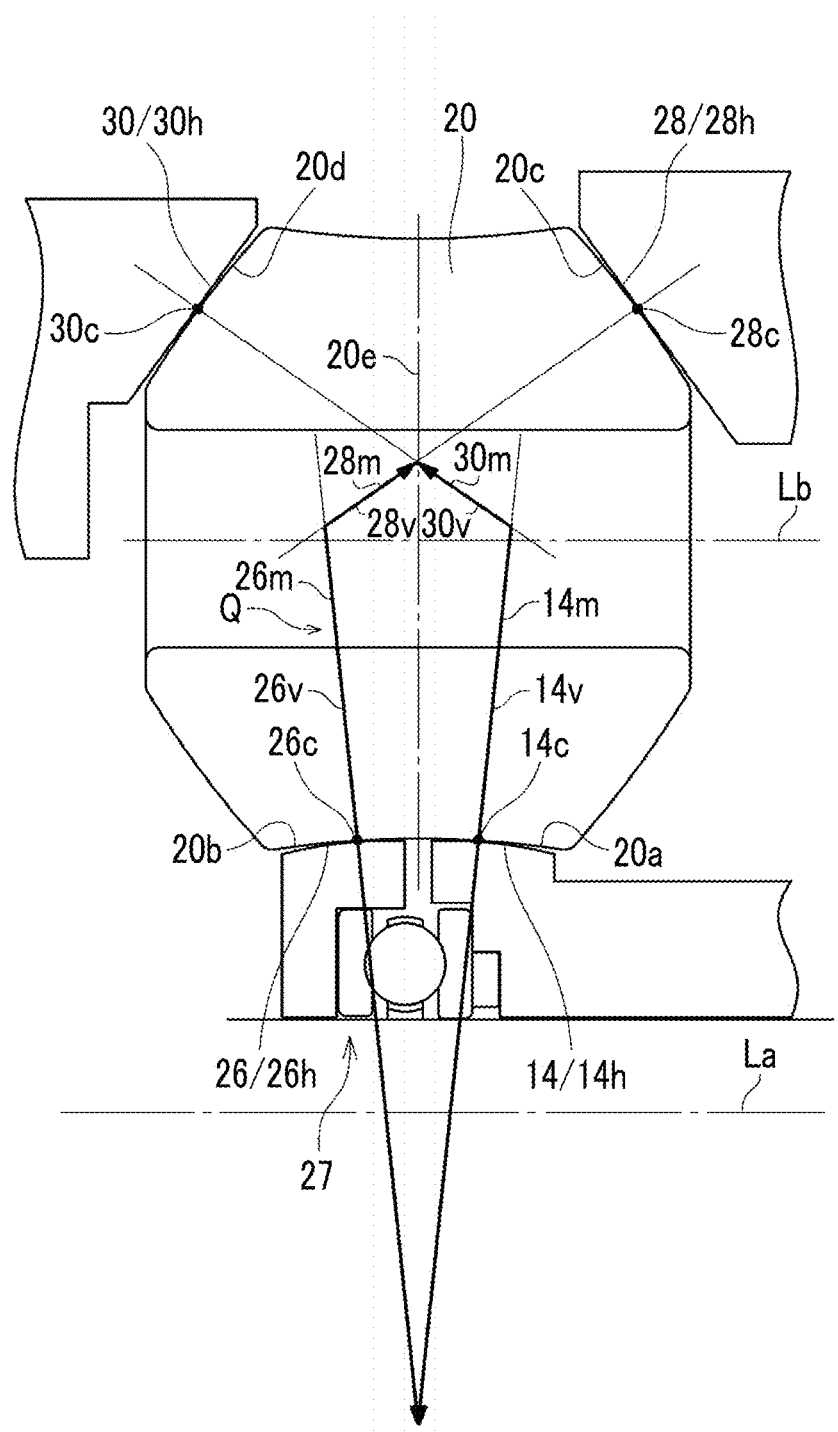
FIG. 17 is an explanatory view for describing a support configuration of the planetary rolling body of FIG. 1.

A characteristic configuration of the present disclosure will be described with reference to FIGS. 2 and 17. FIG. 17 is a view for describing a configuration where the planetary rolling body 20 is supported by each trajectory ring. The drawing shows contour lines (hereinafter, referred to as "sectional curves") that appear in each of sections of the planetary rolling body 20, the input trajectory ring 14, the first support trajectory ring 26, the second support trajectory ring 28, and the output trajectory ring 30 in a plane including the rotation axis line La and the rotation axis Lb.

In the friction transmission device, in a configuration where both the contact surface of the planetary rolling body and the rolling contact surfaces of the trajectory rings that are in contact with the planetary rolling body inward in the radial direction are convex surfaces, the contact surface and the rolling contact surfaces come into convex-convex contact with each other. The convex-convex contact refers to contact in a case where two surfaces that come into contact with each other are both convex surfaces. When the convex-convex contact occurs as described above, contact stress of a contact portion increases, and the life of the contact portion tends to be shortened. Thus, in the embodiment, at least one trajectory ring of the input trajectory ring 14, the output trajectory ring 30, the first support trajectory ring 26, or the second support trajectory ring 28 and the planetary rolling body 20 come into convex-concave contact with each other. The convex-concave contact refers to contact in a case where one of two surfaces that come into contact with each other is a convex surface and the other is a concave surface.

In the example of FIG. 17, the input trajectory ring 14 and the planetary rolling body 20 come into convex-concave contact with each other, and the first support trajectory ring 26 and the planetary rolling body 20 come into convex-concave contact with each other. Specifically, since the rolling contact surface 14h of the input trajectory ring 14 is a convex surface and the contact surface 20a of the planetary rolling body 20 that comes into contact with the rolling contact surface 14h is a concave surface, the rolling contact surface 14h and the contact surface 20a come into convex-concave contact with each other. In addition, since the rolling contact surface 26h of the first support trajectory ring 26 is a convex surface and the contact surface 20b of the planetary rolling body 20 in contact with the rolling contact surface 26h is a concave surface, the rolling contact surface 26h and the contact surface 20b come into convex-concave contact with each other. In this case, contact stress of the contact portion is lower than that in a case of the convex-convex contact, and the life of the contact portion can be extended. The curvature of the convex surface in convex-concave contact is set to be larger than the curvature of the concave surface on a mating side.

FIG. 17 shows an extension line of each normal vector. Depending on the shape of the planetary rolling body, each extension line does not form a quadrangle in some cases, and in this case, the posture of the planetary rolling body is unstable. Therefore, the planetary rolling body 20 of the embodiment has a shape capable of forming a quadrangle by means of an extension line of a normal vector at a contact point between the planetary rolling body 20 and each trajectory ring.

As shown in FIG. 17, extension lines of a normal vector 14v at a contact point 14c, a normal vector 26v at a contact point 26c, a normal vector 28v at a contact point 28c, and a normal vector 30v at a contact point 30c intersect each other to form a quadrangle Q. In this case, the posture of the planetary rolling body 20 is uniquely determined, and the planetary rolling body 20 can maintain a constant posture. In addition, in the example of FIG. 17, lengths of two sides 14m and 26m positioned inward in the radial direction of the quadrangle Q are longer than lengths of two sides 28m and 30m positioned outward in the radial direction. In this case, the posture of the planetary rolling body 20 is further stabilized.

For example, from simulation, it is suggested that the lengths of the two sides 14m and 26m are preferably twice or more and more preferably four times or more the lengths of the two sides 28m and 30m. In this example, the lengths of the two sides 14m and 26m are set to be 4.3 times or more the lengths of the two sides 28m and 30m. In addition, from the simulation, the lengths of the two sides 14m and 26m can be set to 20 times or less the lengths of the two sides 28m and 30m.

When the lengths of the two sides 14m and 26m are long, an angle of a normal line at a contact point between the input trajectory ring 14, the first support trajectory ring 26, and the planetary rolling body with respect to the radial direction is small. When the angle is small, an axial component of a contact load vector (including a radial component and a center axis direction component) at a contact portion is small, and a contact load decreases. In addition, when the angle is small, the curvature of a sectional curve including a center axis in the contact surfaces 20a and 20b (concave surfaces) of the planetary rolling body 20 is small, and the relative curvature of the contact portion is small. As a result, contact stress (contact pressure) can be reduced.

The input trajectory ring 14 and the first support trajectory ring 26, which are positioned inward in the radial direction among the respective trajectory rings, will be referred to as inner trajectory rings 14 and 26. In addition, the second support trajectory ring 28 and the output trajectory ring 30, which are positioned outward in the radial direction among the respective trajectory rings, will be referred to as outer trajectory rings 28 and 30. In the example of FIG. 17, the rolling contact surfaces 14h and 26h of the inner trajectory rings 14 and 26, on which the planetary rolling body 20 rolls, are configured by convex surfaces (inner convex surfaces), and the contact surfaces 20a and 20b of the planetary rolling body 20 with the inner trajectory rings 14 and 26 are configured by concave surfaces (planetary rolling body inner concave surfaces). Since there is a tendency in which contact pressures of the inner trajectory rings 14 and 26 are higher than those of the outer trajectory rings 28 and 30, with this configuration, the contact pressures of the inner trajectory rings 14 and 26 can be reduced.

In this example, the contact surfaces 20a and 20b of the planetary rolling body 20 that come into contact with the inner trajectory rings 14 and 26 are concave surfaces and will be collectively referred to as inner concave surfaces (planetary rolling body inner concave surfaces) 20a and 20b. The contact surfaces 20c and 20d of the planetary rolling body 20 that come into contact with the outer trajectory rings 28 and 30 are convex surfaces and will be collectively referred to as outer convex surfaces (planetary rolling body outer convex surfaces) 20c and 20d. As the planetary rolling body 20 includes the inner concave surfaces 20a and 20b and the outer convex surfaces 20c and 20d, the planetary rolling body 20 can avoid convex-convex contact by configuring the inner trajectory rings 14 and 26 coming into convex-concave contact therewith and configuring the outer trajectory rings 28 and 30 coming into convex-flat contact therewith. For this reason, the contact stress of a contact portion can be reduced. The convex-flat contact refers to contact in a case where one of two surfaces that come into contact with each other is a convex surface, and the other is a flat surface.

As shown in FIG. 17, the first trajectory ring bearing 27 is disposed between the two trajectory rings 14 and 26 that come into contact with the inner concave surfaces 20a and 20b, among the respective trajectory rings 14, 26, 28, and 30. In this case, a thrust load received from the input trajectory ring 14 can be supported, and a speed difference between the input trajectory ring 14 and the first support trajectory ring 26 can be allowed at a low loss. In addition, the first trajectory ring bearing 27 is surrounded by the input trajectory ring 14 and the first support trajectory ring 26. Therefore, a dedicated space for the first trajectory ring bearing 27 can be reduced, which is advantageous in terms of size reduction.

As shown in FIG. 17, the inner concave surfaces 20a and 20b are configured as continuous curved surfaces. When the speed is changed, relative positions of the planetary rolling body 20 and the inner trajectory rings 14 and 26 are changed. Accordingly, a speed change range can be widened by making the inner concave surfaces 20a and 20b continuous curved surfaces. In addition, the inner concave surfaces 20a and 20b can be continuously processed and thus can be easily processed.

In this example, the sectional curves of the inner concave surfaces 20a and 20b are arcs. In this case, the way the surfaces come into contact with each other is less likely to change when the speed is changed, and the speed can be smoothly changed.

In this example, the sectional curves of the outer convex surfaces 20c and 20d are involute curves or arcs. In this case, the speed can be smoothly changed.

The sectional curves of the rolling contact surfaces 14h and 26h of the inner trajectory rings 14 and 26 on which the planetary rolling body 20 rolls are arcs. In this case, the speed can be smoothly changed.

Characteristics of the friction transmission device 100 configured as described above will be described. The friction transmission device 100 is a friction transmission device including the input trajectory ring 14, the planetary rolling body 20 that is disposed about a rotation axis line of the input trajectory ring 14 and that comes into contact with the input trajectory ring 14, the output trajectory ring 30 that comes into contact with the planetary rolling body 20 and that is connected to the output member 32, and the first support trajectory ring 26 and the second support trajectory ring 28 that come into contact with the planetary rolling body 20, in which at least one of the input trajectory ring 14, the output trajectory ring 30, the first support trajectory ring 26, or the second support trajectory ring 28 is a convex-concave contact trajectory ring that comes into convex-concave contact with the planetary rolling body 20.

With this configuration, a friction transmission device capable of reducing contact stress, that is, a contact pressure, of a contact portion lower than that in a case of convex-convex contact can be provided. Since the contact pressure is reduced, the life of the contact portion is extended, and the friction transmission device can be applied to more applications.

The present invention has been described hereinbefore based on some embodiments. It is clear for those skilled in the art that these embodiments are merely examples, various modifications and changes can be made within the scope of the claims of the present invention, and such modification examples and changes are also within the scope of the claims of the present invention. Therefore, the description and the drawings in the present specification are not to be limited and are to be exemplified.

Modification Examples

Hereinafter, modification examples will be described. In the drawings and description of the modification examples, components and members which are the same or equivalent to those of the embodiment will be assigned with the same reference signs. Description that is redundant with the embodiment will be omitted as appropriate, and configurations different from the embodiment will be mainly described.

In the description of the embodiment, an example in which the sectional curves of the inner concave surfaces 20a and 20b are arcs has been described. However, the sectional curves are not limited to thereto. For example, the sectional curves may be curves (parabolas), ellipses, ovals, or the like drawn by a quadratic function.

In the description of the embodiment, an example in which the sectional curves of the outer convex surfaces 20c and 20d are involute curves or arcs has been described, but the sectional curves are not limited thereto. For example, the sectional curves may be curves, ellipses, ovals, or the like drawn by a quadratic function.

In the description of the embodiment, an example in which the sectional curves of the rolling contact surfaces 14h and 26h of the inner trajectory rings 14 and 26 on which the planetary rolling body 20 rolls are arcs has been described, but the sectional curves are not limited thereto. For example, the sectional curves may be curves, ellipses, ovals, or the like drawn by a quadratic function.

In the description of the embodiment, an example in which the rolling contact surfaces 30h and 28h are conical surfaces configured by flat surfaces has been described, but the rolling contact surfaces 30h and 28h may be curved surfaces such as convex surfaces and concave surfaces.

The configuration of the input bearing 66 is not limited and may be, for example, a bearing including a roller which is a rolling body. In addition, the configuration of the first trajectory ring bearing 27 is not limited and may be, for example, a bearing including a roller which is a rolling body. In addition, the configuration of the output trajectory ring bearing 33 is not limited and may be, for example, a bearing including a sphere which is a rolling body. In addition, the configuration of the output bearing 34 is not limited and may be, for example, a bearing including a sphere which is a rolling body.

The configuration of the control unit bearing 63 is not limited and may be, for example, a bearing including a sphere which is a rolling body, a thrust bearing, a sliding bearing, or the like.

For example, in the pressing force application mechanism 7, instead of the roller 53, a sphere may be included, and the pocket 52*b* of the roller holder 52, the cam grooves 56*j* of the pressing cam 56, and the cam grooves 28*j* of the second support trajectory ring 28 may have a shape corresponding to the sphere, respectively.

For example, in the pressing force application mechanism 7, the roller 53 and the roller holder 52 may be removed, and the cam groove 28*j* of the second support trajectory ring 28 may be a convex cam peak including a V-shaped inclined surface, and the cam groove 56*j* of the pressing cam 56 may be configured to come into direct contact with the cam peak. On the other hand, a region corresponding to the cam groove 56*j* of the pressing cam may be the cam peak.

Each of the modification examples has the same operation and effect as those of the embodiment.

Any combination of each of the embodiments and the modification examples described above is also useful as an embodiment of the present invention. A new embodiment generated by the combination has each of the effects of the combined embodiments and modification examples.

The embodiment of the present invention relates to a friction transmission device that can be used in many applications such as a robot and a self-propelled bogie.

It should be understood that the invention is not limited to the above-described embodiment, but may be modified into various forms on the basis of the spirit of the invention. Additionally, the modifications are included in the scope of the invention.

What is claimed is:

1. A friction transmission device comprising:
an input trajectory ring;
a planetary rolling body that is disposed about a rotation axis line of the input trajectory ring and that comes into contact with the input trajectory ring;
an output trajectory ring that comes into contact with the planetary rolling body and that is connected to an output member; and
a first support trajectory ring and a second support trajectory ring that come into contact with the planetary rolling body,
wherein at least one of the input trajectory ring, the output trajectory ring, the first support trajectory ring, or the second support trajectory ring is a convex-concave contact trajectory ring that comes into convex-concave contact with the planetary rolling body,
in the planetary rolling body, a quadrangle is formed by an extension line of a normal vector at a contact point with each of the input trajectory ring, the output trajectory ring, the first support trajectory ring, and the second support trajectory ring, and
lengths of two sides of the quadrangle, which are positioned inward in a radial direction of the rotation axis line, are longer than lengths of two sides, which are positioned outward in the radial direction of the rotation axis line.

2. A friction transmission device comprising:
an input trajectory ring;
a planetary rolling body that is disposed about a rotation axis line of the input trajectory ring and that comes into contact with the input trajectory ring;
an output trajectory ring that comes into contact with the planetary rolling body and that is connected to an output member; and
a first support trajectory ring and a second support trajectory ring that come into contact with the planetary rolling body,
wherein at least one of the input trajectory ring, the output trajectory ring, the first support trajectory ring, or the second support trajectory ring is a convex-concave contact trajectory ring that comes into convex-concave contact with the planetary rolling body,
the convex-concave contact trajectory ring includes an inner trajectory ring positioned inward in a radial direction,
the inner trajectory ring includes an inner convex surface of which a contact surface with the planetary rolling body is configured by a convex surface, and
the planetary rolling body includes a planetary rolling body inner concave surface of which a contact surface with the inner trajectory ring is configured by a concave surface.

3. The friction transmission device according to claim 2,
wherein the input trajectory ring, the output trajectory ring, the first support trajectory ring, and the second support trajectory ring include an outer trajectory ring positioned outward in the radial direction, and
the planetary rolling body includes a planetary rolling body outer convex surface of which a contact surface with the outer trajectory ring is configured by a convex surface.

4. The friction transmission device according to claim 2,
wherein the inner trajectory ring is the input trajectory ring and the first support trajectory ring is provided to be separated from the input trajectory ring in an axial direction,
the input trajectory ring is configured to move in the axial direction, and
a thrust bearing is disposed between the input trajectory ring and the first support trajectory ring.

5. The friction transmission device according to claim 3,
wherein the inner trajectory ring is the input trajectory ring and the first support trajectory ring is provided to be separated from the input trajectory ring in an axial direction,
the planetary rolling body inner concave surface is configured by a continuous curved surface, and
the continuous curved surface comes into convex-concave contact with both an inner convex surface of the input trajectory ring and an inner convex surface of the first support trajectory ring.

6. The friction transmission device according to claim 2,
wherein a sectional curve of the planetary rolling body inner concave surface is an arc.

7. The friction transmission device according to claim 2,
wherein a sectional curve of the inner convex surface is an arc.

8. A friction transmission device comprising:
an input trajectory ring;
a planetary rolling body that is disposed about a rotation axis line of the input trajectory ring and that comes into contact with the input trajectory ring;
an output trajectory ring that comes into contact with the planetary rolling body and that is connected to an output member; and
a first support trajectory ring and a second support trajectory ring that come into contact with the planetary rolling body, wherein at least one of the input trajectory ring, the output trajectory ring, the first support trajectory ring, or the second support trajectory ring is a convex-concave contact trajectory ring that comes into convex-concave contact with the planetary rolling body, the planetary rolling body and one or more additional planetary rolling bodies are disposed at a predetermined interval in a circumferential direction of the rotation axis line, the friction transmission device further comprises a holder that restricts movements of the planetary rolling bodies in the circumferential direction of the rotation axis line, and the holder includes two ring portions that are disposed to be separated from each other in an axial direction with the planetary rolling body interposed between the ring portions.

9. The friction transmission device according to claim 8, wherein the holder further includes a plurality of pillar portions that are disposed between the planetary rolling bodies at a predetermined interval in the circumferential direction of the rotation axis line, and the plurality of pillar portions include one end fixed to an outer periphery of one ring portion of the two ring portions and the other end fixed to an outer periphery of the other ring portion of the two ring portions.

10. The friction transmission device according to claim 9, wherein a pocket is formed between two pillar portions adjacent to each other among the plurality of the pillar portions, and the planetary rolling body is held to be rotatable in the pocket.

\* \* \* \* \*